(12) United States Patent
Horsky et al.

(10) Patent No.: US 7,723,700 B2
(45) Date of Patent: *May 25, 2010

(54) CONTROLLING THE FLOW OF VAPORS SUBLIMATED FROM SOLIDS

(75) Inventors: Thomas N. Horsky, Boxborough, MA (US); Robert W. Milgate, III, Gloucester, MA (US)

(73) Assignee: Semequip, Inc., North Billerica, MA (US)

( * ) Notice: Subject to any disclaimer, the term of this patent is extended or adjusted under 35 U.S.C. 154(b) by 103 days.

This patent is subject to a terminal disclaimer.

(21) Appl. No.: 10/582,524

(22) PCT Filed: Dec. 9, 2004

(86) PCT No.: PCT/US2004/041060

§ 371 (c)(1),
(2), (4) Date: Apr. 5, 2007

(87) PCT Pub. No.: WO2005/060602

PCT Pub. Date: Jul. 7, 2005

(65) Prior Publication Data

US 2008/0047607 A1    Feb. 28, 2008

Related U.S. Application Data

(60) Provisional application No. 60/529,343, filed on Dec. 12, 2003.

(51) Int. Cl.
*A01G 13/06* (2006.01)
*E03B 7/07* (2006.01)
*E03B 5/00* (2006.01)
*G01N 21/01* (2006.01)

(52) U.S. Cl. .......... 250/429; 250/428; 250/425; 250/435; 392/386; 392/387; 392/397; 392/398; 137/486; 137/487.5; 137/563; 137/565.01; 137/565.11; 137/565.13

(58) Field of Classification Search .......... 250/428, 250/425, 430, 435, 423 R, 424, 429; 137/2, 137/7, 8, 12, 486, 487, 487.5, 489, 491, 563, 137/565.01, 565.11, 565.13; 392/386, 387, 392/397, 398, 400, 401

See application file for complete search history.

(56) References Cited

U.S. PATENT DOCUMENTS 4,254,340 A    3/1981    Camplan et al.

(Continued)

FOREIGN PATENT DOCUMENTS

EP    0140975 A1    3/1984

(Continued)

OTHER PUBLICATIONS

J.J. Sullivan et al. "Mass Flow Measurement and Control of Low Vapor Pressure Sources" Journal of Vacuum Science and Technology, Part A, AVS/AIP, Melville, NY US, vol. 7, No. 3, Part 2, May 1, 1989, pp. 2387-2392.
EPO Search Report.

*Primary Examiner*—Bernard E Souw
(74) *Attorney, Agent, or Firm*—John S. Paniaguas; Katten Muchin Rosenman LLP

(57) ABSTRACT

A vapor delivery system for delivering a steady flow of sublimated vapor to a vacuum chamber comprises a vaporizer of solid material, a mechanical throttling valve, and a pressure gauge, followed by a vapor conduit to the vacuum chamber. The vapor flow rate is determined by both the temperature of the vaporizer and the setting of the conductance of the mechanical throttle valve located between the vaporizer and the vacuum chamber. The temperature of the vaporizer is determined by closed-loop control to a set-point temperature. The mechanical throttle valve is electrically controlled, e.g. the valve position is under closed-loop control to the output of the pressure gauge. In this way the vapor flow rate can be generally proportional to the pressure gauge output. All surfaces exposed to the vapor from the vaporizer to the vacuum chamber are heated to prevent condensation.

40 Claims, 20 Drawing Sheets

U.S. PATENT DOCUMENTS

| | | |
|---|---|---|
| 4,409,486 A | 10/1983 | Bates |
| 4,512,812 A | 4/1985 | Liebert et al. |
| 4,529,474 A | 7/1985 | Fujiyama et al. |
| 4,619,844 A | 10/1986 | Pierce et al. |
| 4,640,221 A | 2/1987 | Barbee et al. |
| 4,657,616 A | 4/1987 | Benzing et al. |
| 4,665,315 A | 5/1987 | Bacchetti et al. |
| 4,703,183 A | 10/1987 | Guerra |
| 4,723,967 A | 2/1988 | Tom |
| 4,738,693 A | 4/1988 | Tom |
| 4,786,352 A | 11/1988 | Benzing |
| 4,958,078 A | 9/1990 | Becchetti |
| 4,960,488 A | 10/1990 | Law et al. |
| 4,983,850 A | 1/1991 | Tsukakoshi et al. |
| 5,028,791 A | 7/1991 | Koshiishi et al. |
| 5,049,784 A | 9/1991 | Matsudo |
| 5,083,061 A | 1/1992 | Koshiishi et al. |
| 5,089,747 A | 2/1992 | Koshiishi et al. |
| 5,097,179 A | 3/1992 | Takayama |
| 5,101,110 A | 3/1992 | Matsudo et al. |
| 5,129,958 A | 7/1992 | Nagashima et al. |
| 5,132,545 A | 7/1992 | Shono et al. |
| 5,144,147 A | 9/1992 | Shiozaki et al. |
| 5,158,644 A | 10/1992 | Cheung et al. |
| 5,186,120 A | 2/1993 | Ohnishi et al. |
| 5,206,516 A | 4/1993 | Keller et al. |
| 5,262,652 A | 11/1993 | Bright et al. |
| 5,279,129 A | 1/1994 | Ito |
| 5,281,302 A | 1/1994 | Gabric et al. |
| 5,296,713 A | 3/1994 | Tanaka |
| 5,306,921 A | 4/1994 | Tanaka et al. |
| 5,312,519 A | 5/1994 | Sakai et al. |
| 5,322,710 A | 6/1994 | Visser |
| 5,350,926 A | 9/1994 | White et al. |
| 5,354,698 A | 10/1994 | Cathey, Jr. |
| 5,362,328 A | 11/1994 | Gardiner et al. |
| 5,369,279 A | 11/1994 | Martin |
| 5,429,070 A | 7/1995 | Campbell et al. |
| 5,451,258 A * | 9/1995 | Hillman et al. ............ 118/715 |
| 5,466,942 A | 11/1995 | Sakai et al. |
| 5,486,235 A | 1/1996 | Ye et al. |
| 5,536,330 A | 7/1996 | Chen et al. |
| 5,554,854 A | 9/1996 | Blake |
| 5,576,538 A | 11/1996 | Sakai et al. |
| 5,616,208 A | 4/1997 | Lee |
| 5,633,506 A | 5/1997 | Blake |
| 5,661,308 A | 8/1997 | Benveniste et al. |
| 5,674,574 A | 10/1997 | Atwell et al. |
| 5,676,759 A | 10/1997 | Ye et al. |
| 5,685,916 A | 11/1997 | Ye et al. |
| 5,700,327 A | 12/1997 | Babacz et al. |
| 5,714,738 A | 2/1998 | Hauschulz et al. |
| 5,747,936 A | 5/1998 | Harrison et al. |
| 5,751,002 A | 5/1998 | Ogata et al. |
| 5,779,849 A | 7/1998 | Blalock |
| 5,780,863 A | 7/1998 | Benveniste et al. |
| 5,785,796 A | 7/1998 | Lee |
| 5,788,778 A | 8/1998 | Shang et al. |
| 5,824,375 A | 10/1998 | Gupta |
| 5,832,177 A | 11/1998 | Shinagawa et al. |
| 5,843,239 A | 12/1998 | Shrotriya |
| 5,882,416 A | 3/1999 | Van Buskirk et al. |
| 5,883,364 A | 3/1999 | Frei et al. |
| 5,883,391 A | 3/1999 | Adibi et al. |
| 5,886,355 A | 3/1999 | Bright et al. |
| 5,887,117 A * | 3/1999 | Desu et al. ................. 392/386 |
| 5,932,882 A | 8/1999 | England et al. |
| 5,940,724 A | 8/1999 | Warren |
| 5,993,766 A | 11/1999 | Tom et al. |
| 6,013,332 A | 1/2000 | Goto et al. |
| 6,060,034 A | 5/2000 | Tsukamoto |
| 6,068,729 A | 5/2000 | Shrotriya |
| 6,093,625 A | 7/2000 | Wanger et al. |
| 6,107,634 A * | 8/2000 | Horsky ................. 250/423 R |
| 6,130,436 A | 10/2000 | Renau et al. |
| 6,143,084 A | 11/2000 | Li et al. |
| 6,150,628 A | 11/2000 | Smith et al. |
| 6,160,262 A | 12/2000 | Aoki et al. |
| 6,161,398 A | 12/2000 | Partus |
| 6,178,925 B1 | 1/2001 | Sturm et al. |
| 6,184,532 B1 | 2/2001 | Dudnikov et al. |
| 6,221,169 B1 | 4/2001 | Bernstein et al. |
| 6,242,750 B1 | 6/2001 | Takahashi et al. |
| 6,253,783 B1 | 7/2001 | Carlsen et al. |
| 6,259,105 B1 | 7/2001 | Eddy et al. |
| 6,271,529 B1 | 8/2001 | Farley et al. |
| 6,288,403 B1 | 9/2001 | Horsky et al. |
| 6,313,475 B1 | 11/2001 | Renau et al. |
| 6,335,534 B1 | 1/2002 | Suguro et al. |
| 6,338,312 B2 | 1/2002 | Hayes et al. |
| 6,355,933 B1 | 3/2002 | Tripsas et al. |
| 6,423,976 B1 | 7/2002 | Glavish et al. |
| 6,441,382 B1 | 8/2002 | Huang |
| 6,449,521 B1 | 9/2002 | Gupta |
| 6,452,198 B1 | 9/2002 | Mani et al. |
| 6,452,338 B1 * | 9/2002 | Horsky ................. 315/111.81 |
| 6,464,891 B1 | 10/2002 | Druz et al. |
| 6,479,828 B2 | 11/2002 | Perel |
| 6,486,431 B1 | 11/2002 | Smith et al. |
| 6,489,622 B1 | 12/2002 | Chen et al. |
| 6,498,348 B2 | 12/2002 | Aitken |
| 6,528,804 B1 | 3/2003 | Sullivan et al. |
| 6,545,419 B2 | 4/2003 | Vella |
| 6,559,462 B1 | 5/2003 | Carpenter et al. |
| 6,614,033 B2 | 9/2003 | Suguro et al. |
| 6,617,593 B2 | 9/2003 | Lien |
| 6,620,256 B1 | 9/2003 | Arno et al. |
| 6,639,227 B1 | 10/2003 | Glavish et al. |
| 6,653,643 B2 | 11/2003 | Saadatmand et al. |
| 6,664,547 B2 | 12/2003 | Benveniste |
| 6,670,623 B2 | 12/2003 | Vella |
| 6,670,624 B1 | 12/2003 | Adams et al. |
| 6,686,601 B2 | 2/2004 | Murrell et al. |
| 6,701,066 B2 * | 3/2004 | Sandhu ..................... 392/386 |
| 6,703,628 B2 | 3/2004 | Ye et al. |
| 6,710,358 B1 | 3/2004 | Chen et al. |
| 6,712,084 B2 * | 3/2004 | Shajii et al. ................ 137/12 |
| 6,740,586 B1 | 5/2004 | Wang et al. |
| 6,744,214 B2 * | 6/2004 | Horsky ................. 315/111.81 |
| 6,770,888 B1 | 8/2004 | Benveniste et al. |
| 6,772,776 B2 | 8/2004 | Klebanoff et al. |
| 6,777,696 B1 | 8/2004 | Rathmell et al. |
| 6,797,337 B2 | 9/2004 | Dando et al. |
| 6,818,909 B2 | 11/2004 | Murrell et al. |
| 6,830,631 B2 | 12/2004 | Nenyei et al. |
| 6,835,930 B2 | 12/2004 | Benveniste et al. |
| 6,839,505 B2 * | 1/2005 | Sandhu ..................... 392/386 |
| 6,841,141 B2 | 1/2005 | Arno et al. |
| 6,852,242 B2 | 2/2005 | Sun et al. |
| 6,885,014 B2 | 4/2005 | Benveniste |
| 6,885,812 B2 | 4/2005 | Groom |
| 6,909,102 B1 | 6/2005 | Buccos |
| 6,909,839 B2 * | 6/2005 | Wang et al. .................. 392/389 |
| 6,921,062 B2 | 7/2005 | Gregg et al. |
| 6,946,667 B2 | 9/2005 | Chen et al. |
| 6,956,225 B1 | 10/2005 | Benveniste |
| 6,958,481 B2 | 10/2005 | Horsky et al. |
| 6,992,311 B1 | 1/2006 | Ring et al. |
| 7,050,708 B2 * | 5/2006 | Sandhu ..................... 392/386 |
| 7,437,060 B2 * | 10/2008 | Wang et al. .................. 392/389 |
| 2003/0030010 A1 * | 2/2003 | Perel et al. ................. 250/424 |
| 2003/0072875 A1 | 4/2003 | Sandhu |
| 2003/0111014 A1 | 6/2003 | Donatucci et al. |
| 2004/0175160 A1 | 9/2004 | Groom |

| | | | | | |
|---|---|---|---|---|---|
| 2004/0175759 A1* | 9/2004 | Holvoet et al. ............... 435/7.1 | EP | 0479375 | 4/1992 |
| 2005/0169828 A1 | 8/2005 | Spielvogel et al. | EP | 0555 546 A1 | 12/1992 |
| 2005/0202657 A1 | 9/2005 | Borland et al. | EP | 0648861 A1 | 10/1994 |
| 2005/0258380 A1 | 11/2005 | White et al. | EP | 0697 467 A1 | 7/1995 |
| 2005/0263075 A1* | 12/2005 | Wang et al. ................. 118/726 | EP | 0762469 A1 | 8/1996 |
| 2005/0277246 A1 | 12/2005 | Kirkpatrick et al. | JP | 55-145338 | 11/1980 |
| 2006/0017010 A1 | 1/2006 | Vanderberg et al. | JP | 56-026539 | 3/1981 |
| 2006/0037540 A1 | 2/2006 | Woelk et al. | JP | 56-166935 | 12/1981 |
| 2006/0097193 A1* | 5/2006 | Horsky et al. .......... 250/492.21 | JP | 61-135037 | 6/1986 |
| 2006/0237063 A1* | 10/2006 | Ding et al. ............... 137/487.5 | JP | 63-050961 | 4/1988 |
| 2006/0237136 A1* | 10/2006 | Nguyen et al. ......... 156/345.29 | JP | 02-155147 | 6/1990 |
| 2006/0272775 A1* | 12/2006 | Horsky et al. ......... 156/345.37 | JP | 06-084837 | 3/1994 |
| 2007/0186983 A1* | 8/2007 | Ding et al. ............... 137/487.5 | JP | 08-290964 | 5/1996 |
| 2007/0210260 A1* | 9/2007 | Horsky et al. ............... 250/424 | TW | 425599 | 3/2001 |
| 2008/0047607 A1* | 2/2008 | Horsky et al. .................. 137/8 | TW | 522214 | 3/2003 |
| 2008/0073559 A1* | 3/2008 | Horsky et al. ............... 250/428 | TW | 539836 | 7/2003 |
| 2008/0121811 A1* | 5/2008 | Horsky et al. ............... 250/424 | WO | WO 96/15545 | 5/1996 |
| | | | WO | WO 02/43803 | 6/2002 |
| | FOREIGN PATENT DOCUMENTS | | WO | WO 2005/060602 | 7/2005 |
| EP | 0474108 A1 | 8/1991 | * cited by examiner | | |

CONTROLLING THE FLOW OF VAPORS SUBLIMATED FROM SOLIDS

CROSS-REFERENCE TO RELATED APPLICATIONS

This application is the U.S. national phase under 35 U.S.C. 371 of International Patent Application No. PCT/US2004/041060, filed Dec. 9, 2004, which claims priority to and the benefit of U.S. Provisional Patent Application No. 60/529,343, filed Dec. 12, 2003.

TECHNICAL FIELD

This invention relates to the controlled sublimation of solid materials under vacuum combined with accurate control of flow of the produced vapor to a vacuum chamber with little pressure drop. An important application is the controlled feed of vapor into the evacuated ionization chamber of an ion source for producing an ion beam. The beam may be used for ion implantation into semiconductor substrates. Another important application is the controlled flow of vapor into a vacuum processing chamber for interaction with a work piece.

BACKGROUND

The ionization chamber of an ion source functions under vacuum and requires the material that is to be ionized to be fed in gaseous form with great accuracy and reproducibility.

Many manufacturing processes also are conducted in vacuum. Those which incorporate chemical reactions with a workpiece typically require introduction of reagents in gaseous form, the reagents being made to react with one another and/or the workpiece through specific process chemistries. Such processes may result in altering the composition of the work piece, deposition of thin films on the work piece, or etch or removal of material from the workpiece. In semiconductor manufacturing, for instance, such processes must be performed with great accuracy and reproducibility.

Thus, for ion sources as well as for work piece processing chambers, the introduction of a precise and stable flow of gas into a vacuum chamber is required. While many feed materials are available in gaseous form from pressurized gas cylinders, others are only available in solid form. Solid materials require special handling steps different from those used with gaseous sources. Among the solid materials of interest are decaborane, octadecaborane, indiumtrichloride, trimethylindium and triethylantimony.

Solids of interest typically have low vapor pressure and must first be sublimated through heating in a reduced pressure environment to produce a volume of vapor. This vapor must then be introduced into the vacuum chamber at the flow, or number of molecules per second, required by the operation to be conducted in the chamber. Since this flow requirement is similar to that required for the introduction of normal gases, standard gas handling equipment has been used for delivery of solid-derived vapor, but with mixed success. In typical gas handling, the gas source is held at a pressure $P_0$ substantially higher than the inlet delivery pressure, $P_D$, for the vacuum chamber. In order to accurately control the flow of gas into the vacuum chamber, $P_D$ must be accurately controlled. This is usually accomplished by a commercially available mass flow controller (MFC) located between the gas source and vacuum chamber inlet. An MFC is a digitally controlled device which varies its conductance to match the delivered mass flow (in grams per second) with the requested mass flow, in a closed-loop manner. Since MFC's are commonly used with relatively high pressure gas sources, MFC's are commonly constructed to operate in a range of correspondingly small conductances, which establish relatively large pressure drops. For vaporized solid materials such as the borohydride decaborane ($B_{10}H_{14}$) or octadecaborane ($B_{18}H_{22}$), this approach suffers from several serious problems.

The vapor pressure of such solid borohydrides is low, so the material must be heated close to its melting point (100 C for decaborane) to establish a sufficiently elevated vapor pressure to permit use of the MFC. This risks decomposition of the borohydride molecule which is thermally sensitive.

Since the borohydride vapor readily condenses on surfaces, especially surfaces below the temperature at which the material was vaporized, clogging of relatively small MFC conductances (small passages) results in unstable operation and early component failure.

These problems have largely stood in the way of commercially viable implementation of vapor flow control systems for the controlled delivery of such borohydride vapor feed to ion sources, in which the produced ion beam is used in an ion implanter for the doping of semiconductors.

Further complications ensue when the vapors are derived from a fixed solid charge. Typically, to provide a large surface area, the material of the charge is placed in the vaporizer in powder form. The vaporizing area of the fixed charge diminishes over time as the charge is consumed, and especially when the solid materials are susceptible to molecular disassociation if temperatures become too high. Serious problems arise especially when the operation in which the vapors are to be employed requires accurate maintenance of vapor flow, which is often the case.

The control of flow of vapors from solid materials has not been as accurate as desired, and has involved the necessity of frequent maintenance of equipment, for instance to disassemble flow control equipment to remove deposits of condensed material that affect their operation. All of these detrimental conditions confront the ion implantation of semiconductor substrates when seeking to use the desired dopant materials decaborane, octadecaborane and other thermally unstable or otherwise thermally sensitive compounds.

SUMMARY

A vapor delivery system for delivering a steady flow of sublimated vapor to a vacuum chamber comprises a vaporizer of solid material, a mechanical throttling valve, and a pressure gauge, followed by a vapor conduit to the vacuum chamber. The vapor flow rate is determined by both the temperature of the vaporizer and the setting of the conductance of the mechanical throttle valve. Preferred embodiments have one or more of the following features. The temperature of the vaporizer is determined by closed-loop control to a set-point temperature. The mechanical throttle valve is electrically controlled, e.g. the valve position is under closed-loop control to the output of the pressure gauge. In this way the vapor flow rate can be generally proportional to the pressure gauge output. All surfaces exposed to the vapor from the vaporizer to the vacuum chamber are heated, to prevent condensation. A gate valve acts as the upstream throttling valve. A rotary butterfly valve acts as the upstream throttling valve. Employing a fixed charge of solid material, the temperature of the vaporizer may be held steady for a prolonged period, during which the throttle valve is gradually opened from a lower conductance in its operating range as the charge sublimes. When a greater valve displacement is reached, the temperature is raised, to enable the valve to readjust to its lower conductance setting from which it can again gradually open.

One particular feature is a vapor delivery system for delivering a controlled flow of vapor sublimated from a solid material to a vacuum chamber, comprising the combination of a heated vaporizer for the solid material operable at sub atmospheric pressure and a vapor delivery passage from the vaporizer to the vacuum chamber, the vapor delivery passage including a throttle valve followed by a vapor conduit, a pressure gauge that is responsive to sub atmospheric pressure being located between the throttle valve and the vapor conduit, surfaces of the vapor delivery passage that are exposed to the sublimed vapor, including such surfaces of the throttle valve, the pressure gauge and the vapor conduit, being adapted to be held at temperature above the condensation temperature of the solid material, and a closed-loop control system incorporating the pressure gauge being constructed to vary the conductance of the throttle valve to control the sub atmospheric pressure of the vapor downstream of the throttle valve in response to the output of the pressure gauge, flow of vapor to the vacuum chamber being determined by pressure of the vapor in the region of the passage between the throttling valve and the vapor conduit.

Embodiments of this feature have one or more of the following features.

The vapor delivery system includes a temperature controlling system adapted to hold the temperatures of the surfaces of the delivery passage above the temperature of the vaporizer.

The vapor delivery system has multiple stages of the vapor delivery passage adapted to be held at progressively higher temperatures, the more distant the stages are from the vaporizer.

The system has the vapor flow rate adapted to be determined by both a control system for the temperature of the vaporizer and a control system for the conductance of the throttle valve.

The temperature of the vaporizer is determined by closed-loop control to a set-point temperature.

The maximum $N_2$ conductance of the throttle valve is at least 1 liter per second.

The pressure drop across the throttle valve when the valve is fully open is less than 100 mTorr.

The maximum conductance of the throttle valve is at least 5 or 10 times the conductance of the vapor conduit.

The throttle valve is a variable position gate valve or is of the butterfly-type.

The vaporizer is constructed to operate with a rechargeable fixed charge of the solid material which is progressively consumed in a manner to reduce the vapor-emitting area of the solid material, and the control system is constructed, in response to a decrease in flow or pressure beyond the valve, to reset the position of the throttle valve to recover the desired flow, and also from time to time as the throttle valve nears its maximum useful conductance, to elevate the temperature of the vaporizer to raise the pressure in the vaporizer and enable the valve to operate within its preferred conductance dynamic range.

In preferred form the vaporizer delivery system includes a throttle valve-based sensing and control system capable of providing a vaporizer set-point temperature value to a regulator of a vaporizer heater that is capable of maintaining the vaporizer temperature at the set-point, the sensing and control system storing at least one predetermined valve displacement value representing a desired upper conductance limit for the throttle valve, the sensing and control system constructed to monitor the position of the throttle valve, and upon detecting the valve nearing or reaching that displacement value, the sensing and controller system constructed to raise the set-point temperature value to the regulator heater to cause increased vapor generation and vapor pressure upstream of the throttle valve, thereby to enable the closed loop control of the throttle valve to cause the valve to return to a substantially lower conductance position. In a preferred embodiment of this feature the vaporizer delivery includes a reference table of predetermined increments of temperature rise suitable for operation, and the sensing and control system effective, upon detecting the valve nearing or reaching the displacement value, to cause the vaporizer temperature set-point to be incremented to the next step in the reference table.

The vapor delivery system is constructed and arranged to deliver ionizable vapor to an ion source.

The vapor delivery system is constructed and arranged to deliver ionizable vapor to an ion source of an ion implanter.

The vapor delivery system is constructed and arranged to deliver ionizable vapor to a work piece processing vacuum chamber or a process chamber for dosing semiconductors.

The vapor delivery system is constructed to convey its vapor to a high vacuum, the system constructed to respond to decrease in sub-atmospheric pressure downstream of the throttle valve to increase the temperature of the vaporizer.

The control system of the vapor delivery system includes a servo loop which adjusts the throttle valve position in response to the output signal of the pressure gauge to maintain the vapor pressure at the gauge to a set-point value.

The vapor delivery system is constructed to contain and evaporate decaborane, $B_{10}H_{14}$ or octadecaborane, $B_{18}H_{22}$.

The vapor delivery system is constructed to contain and evaporate indium trichloride ($InCl_3$), trimethyl indium [In$(CH_3)_3$], or other solid low-temperature dopant feed materials.

Another feature is a method of producing an ion beam in a vacuum chamber conducted by use of the vapor delivery system described, when adapted to deliver a controlled ionizable flow of vapor sublimated from a solid material to an ionization chamber.

Another feature is a method of delivering a controlled flow of vapor sublimated from a solid material to a vacuum chamber performed by use of the vapor delivery system having one or more of the features described above.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1A shows an ion source with a vapor delivery system while

FIG. 5 shows semiconductor dopant flow to a vacuum doping process; FIG. 6 shows flow into an ion source producing an ion beam for high vacuum ion implantation into the surface of a semiconductor substrate; and FIG. 7 shows such flow into an ion source of a high vacuum ion implant chamber to implant mass-resolved implant dopant ions into the surface of a semiconductor substrate.

Like reference symbols in the various drawings indicate like elements.

DETAILED DESCRIPTION

Figure 3:
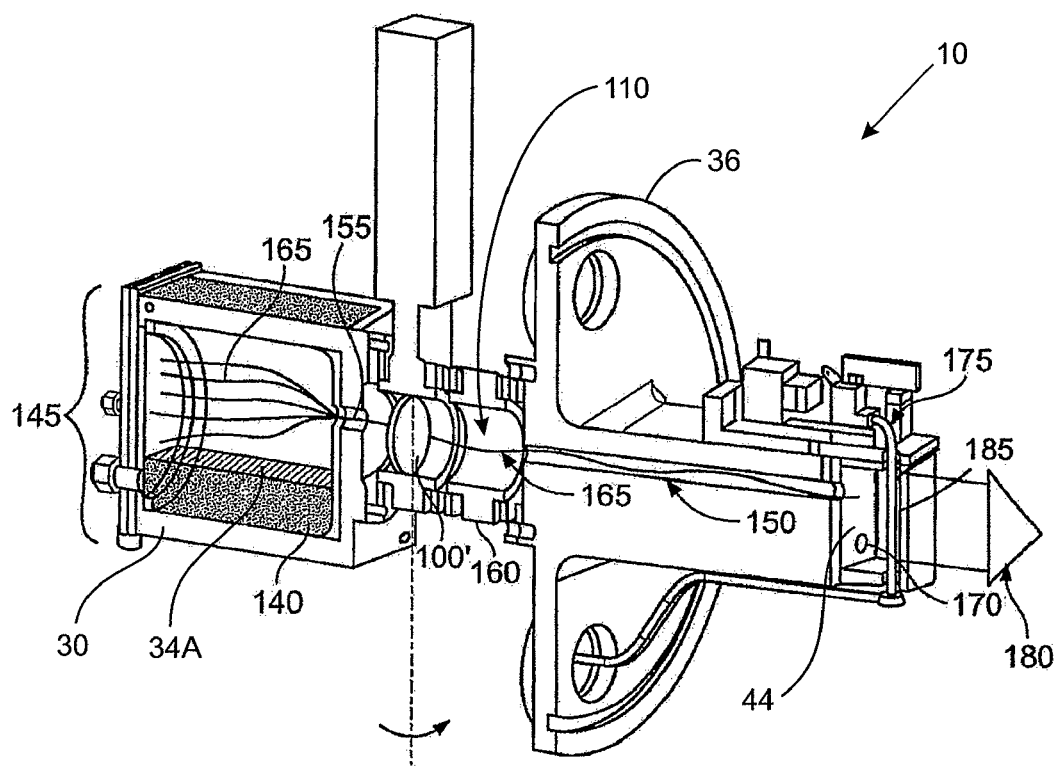
FIG. 3 shows an ion source with another vapor delivery system.

FIG. 3 is a diagram of an ion source 10. The details of its construction, as well as its preferred modes of ionizing action, are disclosed in detail by Horsky et al., International Application No. PCT/US03/20197, filed Jun. 26, 2003: "An ion implantation device and a method of semiconductor manufacturing by the implantation of boron hydride cluster ions", and by Horsky, U.S. patent application Ser. No. 10/183,768, "Electron impact ion source", filed Jun. 26, 2002, U.S. Pat. No. 6,686,595, each herein incorporated by reference. The ion source 10 is made to interface to an evacuated vacuum chamber of an ion implanter by way of a mounting flange 36. Thus, the portion of the ion source 10 to the right of flange 36, shown in FIG. 3, is under a high vacuum (pressure<$1\times10^{-4}$ Torr). The ion source is maintained at an elevated voltage by a high voltage power supply and is electrically isolated from remaining portions of the high vacuum housing. Gaseous material is introduced into ionization chamber 44 in which the gas molecules are ionized by electron impact from electron beam 70A or 70B. The electron beam exits ionization chamber 44 through the opposite aperture 71B or 71A, or may be absorbed by a beam dump or walls of the chamber acting as a beam dump. In one embodiment incorporating a single electron gun and a beam dump, shown in FIG. 1B, the electron beam originates from a cathode in the electron gun 112, is bent by a magnetic field 135 produced by magnet 130 and pole pieces 125, and enters the ionization chamber 44 through electron entrance aperture 71A or 71B such that electron beam 70A or 70B moves parallel to an elongated ion extraction aperture 81. After leaving ionization chamber 44 the electron beam 70 is stopped by beam dump 72 located external to ionization chamber 44. Thus, ions are created adjacent to the ion extraction aperture 81, which appears as a slot in the ion extraction aperture plate 80. The ions are then extracted and formed into an energetic ion beam by an extraction electrode (not shown) located in front of the ion extraction aperture plate 80, and held at a substantially lower voltage.

Figure 1:
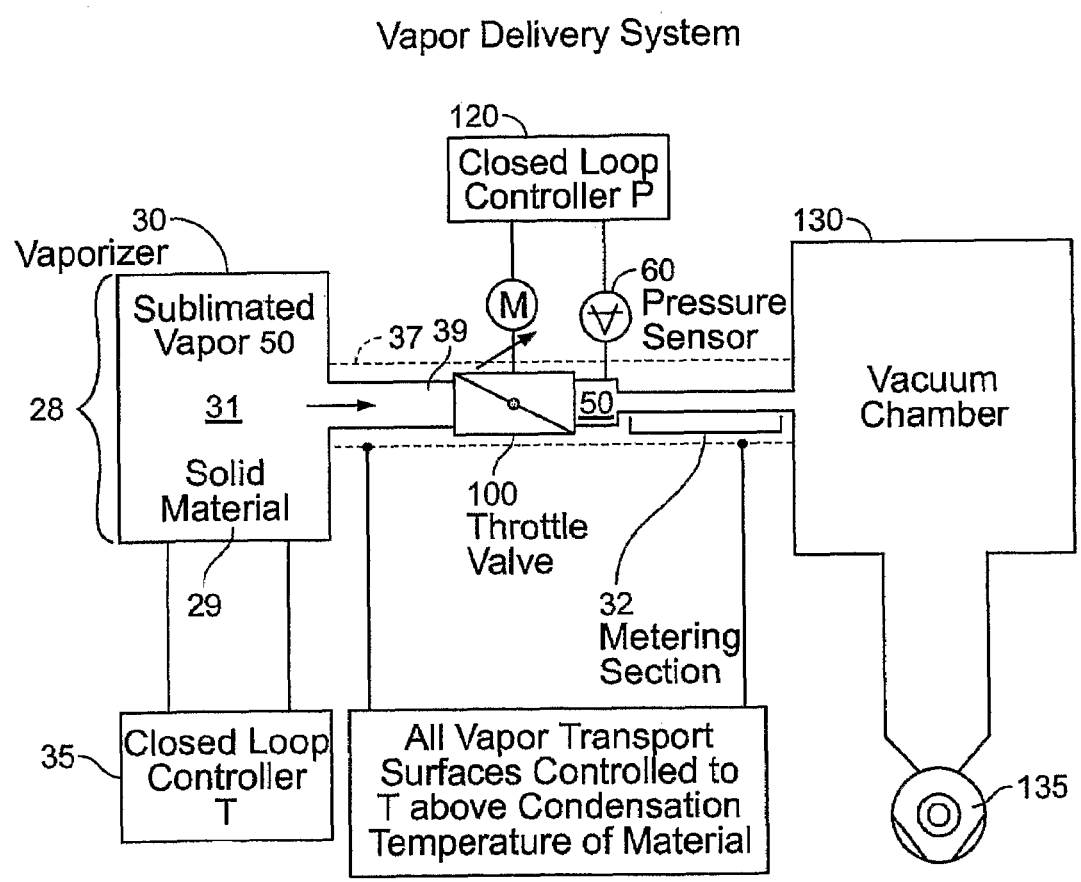
FIG. 1 shows a simplified schematic of a vapor delivery system of the present invention.
Figure 1A:
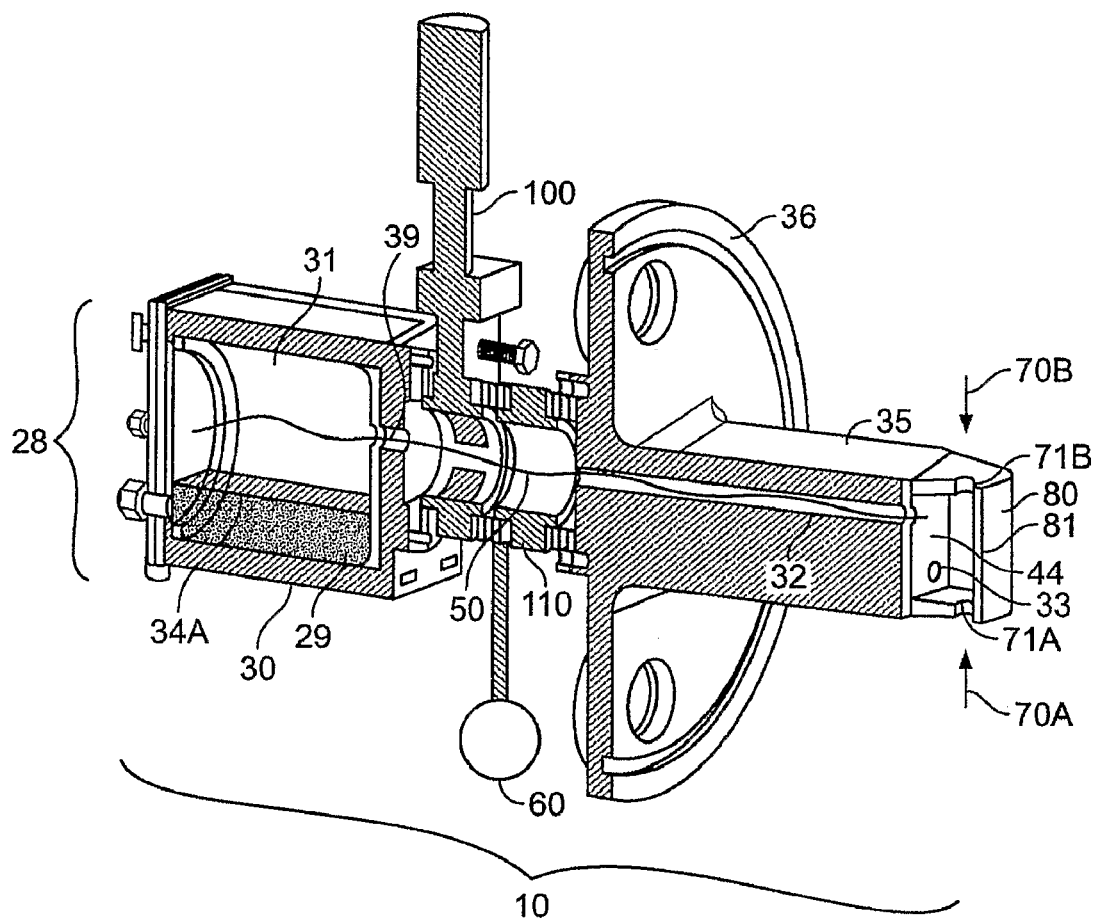
Figure 1B:
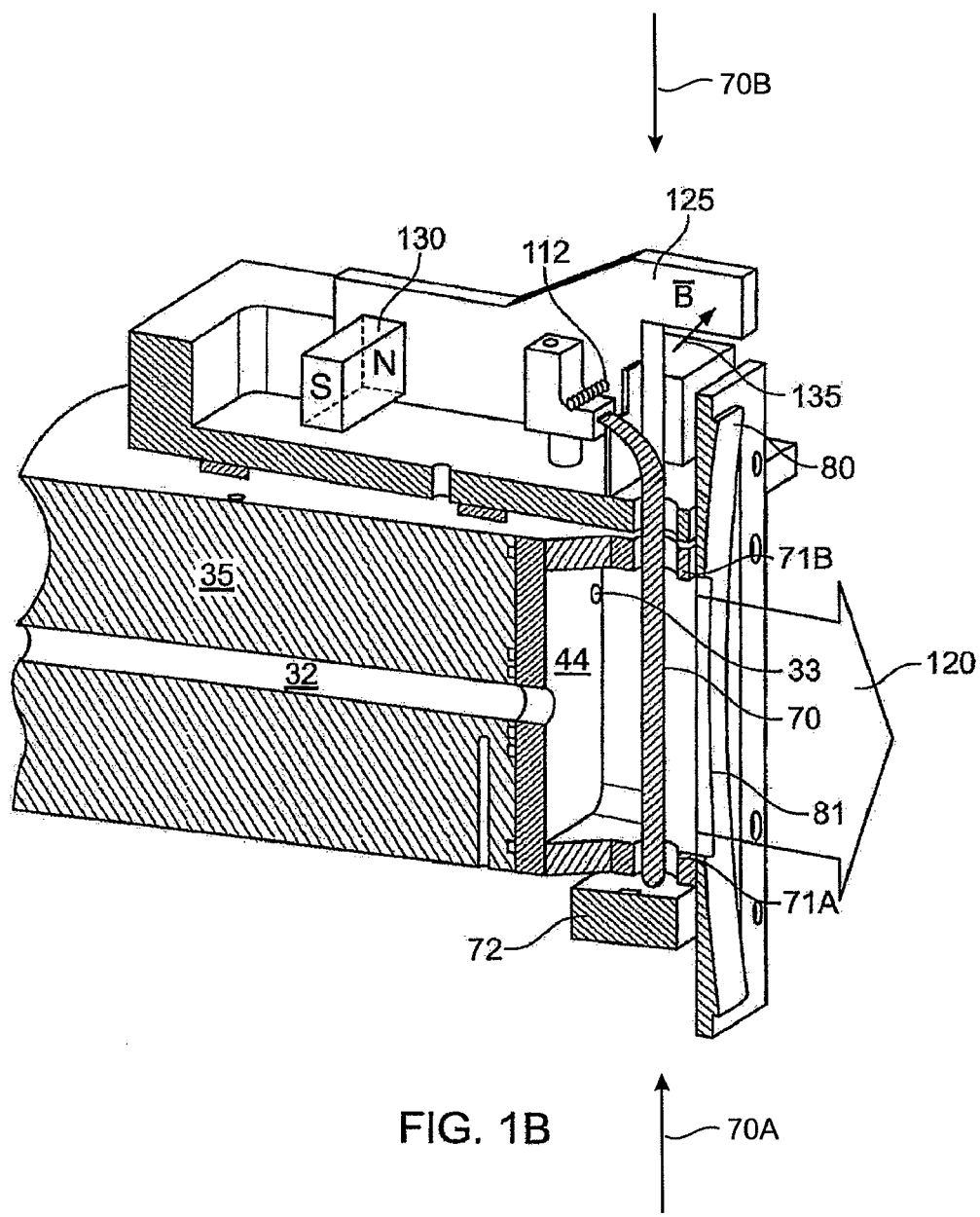
FIG. 1B shows a detail of one embodiment of the ion source.
Figure 5:
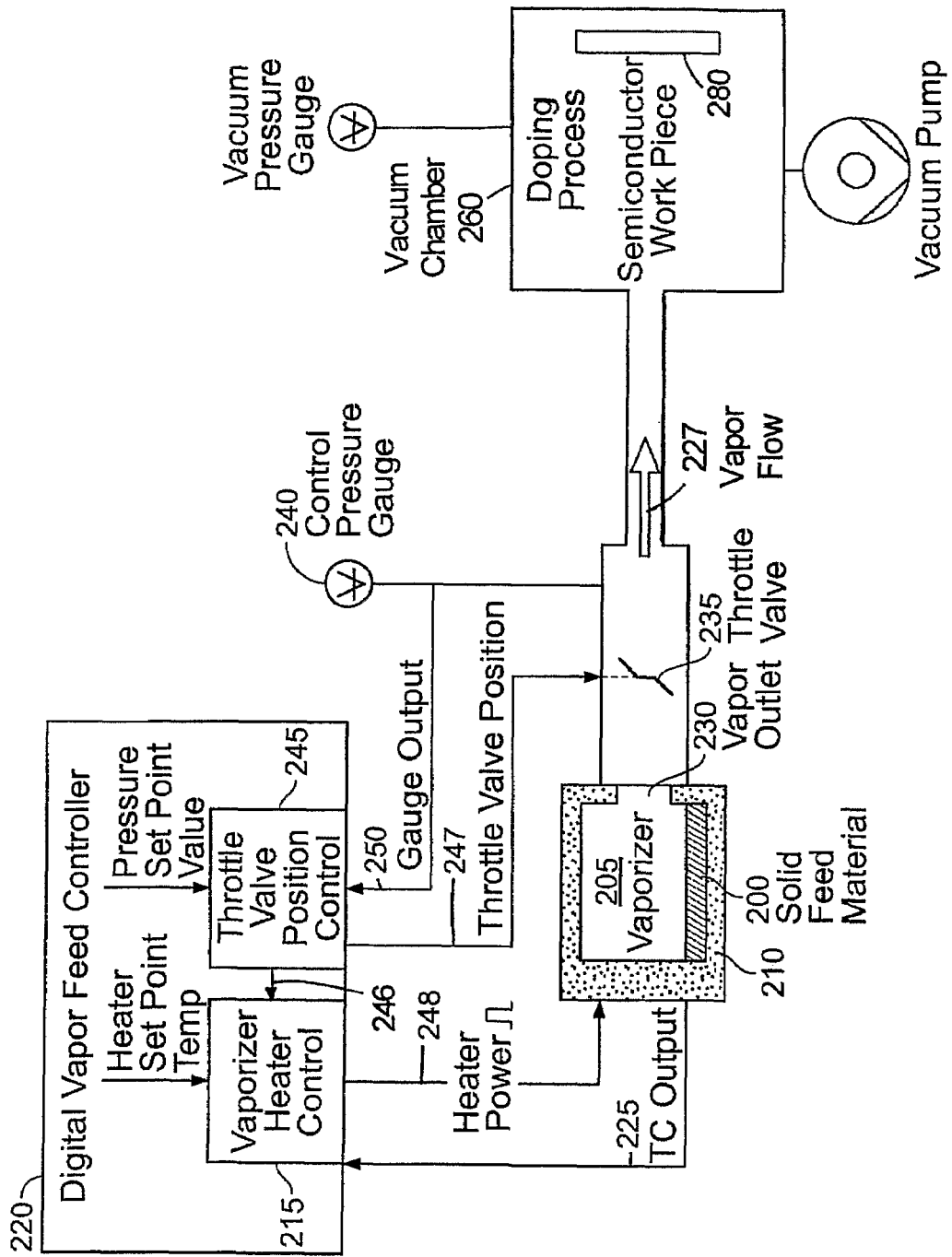
FIGS. 5, 6 and 7, each similar in form to FIG. 4, show systems to produce accurately controlled flow of sublimated vapors.

Referring to FIG. 1B, gases may be fed into the ionization chamber 44 via a gas conduit 33. Solid feed materials such as decaborane and octadecaborane can be vaporized in vaporizer 28, and the vapor fed into the ionization chamber 44 through vapor conduit 32 within the source block 35. Typically, ionization chamber 44, ion extraction aperture 80, source block 35 (including vapor feed conduit 32), and vaporizer housing 30 are all fabricated of aluminum. Solid feed material 29 (FIG. 1), located under a perforated separation barrier 34a (FIG. 5), is held at a uniform temperature by closed-loop temperature control of the vaporizer housing 30 (FIG. 5). Sublimated vapor 50 (FIG. 1) which accumulates in a ballast volume 31 feeds through conduit 39 and through throttling valve 100 and shutoff valve 110 (FIG. 3). The nominal pressure of vapor 50 (FIG. 1) between throttling valve 100 (FIG. 1) and shutoff valve 110 (FIG. 3) is monitored by capacitance manometer gauge 60 (FIG. 1). The vapor 50 feeds into the ionization chamber 44 through a vapor conduit 32, located in the source block 35. Thus, both gaseous and vaporized materials may be ionized by this ion source.

The flow of vapor to ionization chamber 44 is determined by the vapor pressure in the region just before vapor feed conduit 32, i.e., within shutoff valve 110. This is measured by a capacitance manometer pressure gauge 60 located between throttling valve 100 and shutoff valve 110. In general, the flow rate is proportional to the vapor pressure. This allows the pressure signal to represent flow, and to be used as a set-point to select flow. To generate a desired vapor flow into the ion source, vaporizer housing 30 is brought to a temperature such that when throttling valve 100 is in its fully open position, the desired flow rate is exceeded. Then the throttling valve 100 is adjusted to reach the desired pressure output. To establish a stable flow over time, separate closed-loop control of the vaporizer temperature and vapor pressure is implemented using dual PID controllers, such as the Omron E5CK digital controller. The control (feedback) variables are thermocouple output for temperature, and gauge output for pressure.

The particular ion source shown is an electron-impact ion source which is fully temperature-controlled. Instead of striking an arc-discharge plasma to create ions, this ion source uses a "soft" electron-impact ionization of the process gas by energetic electrons injected in the form of one or more focused electron beams. The "soft" ionization process preserves the large molecules so that ionized clusters are formed. As seen in FIG. 1A and FIG. 1B, solid boron hydride is heated in the vaporizer and flowed through the vapor conduit to a metal chamber, i.e., the ionization chamber. An electron gun located external to the ionization chamber delivers a high-current stream of energetic electrons into the ionization chamber; this electron stream is directed roughly parallel and adjacent to an extended slot in the front of the chamber. Ions are extracted from this slot by an ion extraction electrode, forming an energetic ion beam. During transport of the sublimated boron hydride vapor to the ionization chamber all surfaces are held at a higher temperature than that of the vaporizer (but well below the temperature of dissociation), to prevent condensation of the vapor. Over many hours of testing, we have confirmed that the surfaces of the vapor feed and valves indeed remain clean.

The throttle valve presents a vapor path of varied conductance. FIGS. 7E, F and G, respectively illustrate a gate valve closed, opened a first amount and opened a second, greater amount, functioning as a high maximum conductance throttle valve.

As generally represented diagrammatically in FIG. 1, a vapor delivery system is provided for delivering a steady flow of sublimated vapor to a vacuum chamber 130. The vacuum chamber may be an ionization chamber having a different ionizing action than that described above, or may be a vacuum processing chamber in which the vapor interacts with other material. The vapor delivery system is comprised of a vaporizer 28, a mechanical throttling valve 100, and a pressure gauge 60. The vapor flow rate is determined by both the temperature of the vaporizer 28 and the conductance of the mechanical throttle valve 100 located between the vaporizer and the inlet conduit 32 to the vacuum chamber. The temperature of the vaporizer 28 is determined by closed-loop control 35 to a set-point temperature. The mechanical throttle valve 100 is electrically controlled, i.e. the valve position is under closed-loop control 120 to the output of the pressure gauge. The vapor flow rate may be held proportional to the pressure gauge output.

The vapor delivery system described meets the challenges inherent in delivering a controlled vapor flow over many hours into a vacuum system, e.g. into the ionization chamber of an ion source or more generally, to an operation performed in a vacuum chamber. The system enables certain rules to be observed, which offer significant advantages over prior systems, especially when using low-temperature materials such as decaborane or octadecaborane:

Minimize the temperature, thus the vapor pressure, in the vaporizer;
Maximize the vapor conductance of the delivery chain;
Use high-conductance, heatable valves;
Keep maximum component temperature low, e.g. below 150 C for the borohydrides;
Temperature control all surfaces which present contact surfaces to the vapor to prevent condensation;
Close the loop on pressure downstream of the throttle valve rather than trying to directly measure the mass flow, eliminating the need for conventional MFC'S;
Allow for adjusting the vaporizer temperature upwards over time as the feed material is depleted, to allow for full consumption of the vaporizer material, and to stabilize the pressure servo loop by allowing the throttle valve to operate in the "sweet spot" of its conductance dynamic range.

Of course, these rules are not all independent, the variables are related one to another, however, each rule solves or ameliorates a distinct problem found in prior systems, and so should be clearly stated.

The form of the closed loop-controlled, pressure based system intended to deliver sublimed, gas phase material into a vacuum chamber with continuous pumping obeys well-defined laws. Referring again to FIG. 1 solid material 29 is vaporized to vapors 50 contained in reservoir 31. The vapors exit reservoir 31 through vaporizer outlet 39, creating a vapor pressure in advance of a throttle (or "throttling") valve 100. Beyond throttle valve 100 is a pressure gauge (or sensor) 60 followed by a relatively flow-restricting vapor conduit 32 which represents a flow restriction leading to the vacuum chamber. Throttle valve 100 and pressure sensor 60, in combination with a closed-loop controller 120, provide means to control the pressure beyond throttle valve 100 (before conduit 32) by closed-loop control of the throttle valve conductance. Thus, the degree the throttle valve 100 is open (valve position) is actively set in real-time by closing the loop on the pressure sensor output, thus serving the valve position to a downstream pressure set-point. The rate of vapor flow into the vacuum chamber 130 is determined by this downstream pressure and the conductance of vapor outlet conduit 32. Conduit 32, under common nomenclature is characterized as the "metering section" of the flow control system. Conduit 32 introduces vapor into vacuum chamber 130, while vacuum of desired value is maintained in vacuum chamber 130 by vacuum pump 135.

The basic gas dynamic requirement for flow in such a system is that the gas phase pressure of the substance to be controlled is higher in the vapor reservoir 31 than it is in the vacuum chamber 130. Pressure-based mass flow control is implemented in such a system by considering the basic equations governing flow in vacuum systems. The simplest case to model is the case of molecular flow, where the mean free path of the gas molecules is large with respect to the physical dimensions of the vacuum system. The molecular flow regime is appropriate to describe the vapor flow into ion implantation systems, for example, using the system of the present invention where the pressure anywhere in the vapor path is <<1 Torr. For any such system the mass flow rate between any two points can be calculated if the pressure P at each of the two points of interest and the conductance C between the two points is known.

The mass flow equation for the metering section 32 is:

$$Q_{MeteringSection} = (P_{PressureSensor} - P_{VacuumChamber}) (C_{MeteringSection}). \quad (1)$$

(Q represents mass flow or throughput in grams/s, for example).

Note that if $P_{VacuumChamber} << P_{PressureSensor}$ (which is the case even at very low mass flow rates if $C_{MeteringSection} << S_{VacuumChamber}$ [i.e., the pumping speed S in the vacuum chamber 130]), Eq. (1) simplifies to $$Q_{MeteringSection} \sim (P_{PressureSensor})(C_{MeteringSection}). \quad (2)$$

From the continuity requirements of gas dynamics, for steady state flow, and the defined flow path, Q at any point in the delivery chain downstream of vapor reservoir 31 must equal Q at any other point in the delivery chain. Thus, $$Q_{AcrossThrottleValve} = Q_{MeteringSection}. \quad (3)$$

We note that the conductance from the vapor reservoir 31 to the throttling valve 100 is large compared to $C_{MeteringSection}$. If we define $P_{upstream}$ as the pressure at the vaporizer outlet 39 from the vaporizer, then:

$$Q_{AcrossThrottlingValve} = (P_{Upstream} - P_{PressureSensor})(C_{ThrottlingValve}). \quad (4)$$

It is also clear that, since Q is preserved across the chain, $$Q_{AcrossThrottlingValve} = Q_{MeteringSection} = (P_{Upstream} - P_{VacuumChamber})(C_{Upstream-VacuumChamber}) \quad (5)$$

For the simple case of molecular flow, series conductances with no beaming effects, and no discrete exit losses, the overall conductance is:

$$1/C_{Overall} = 1/C_1 + 1/C_2 + 1/C_3 \ldots 1/C_n \quad (6)$$

For the present case, one can calculate the effective conductance between the vapor outlet from the vaporizer and vacuum chamber 130:

$$1/C_{Upstream-VacuumChamber} = 1/C_{ThrottlingValve} + 1/C_{MeteringSection} \quad (7)$$

Rearranging terms:

$$C_{Upstream-VacuumChamber} = ((C_{ThrottlingValve})(C_{MeteringSection}))/(C_{ThrottlingValve} + C_{MeteringSection}) \quad (8)$$

Figure 2:
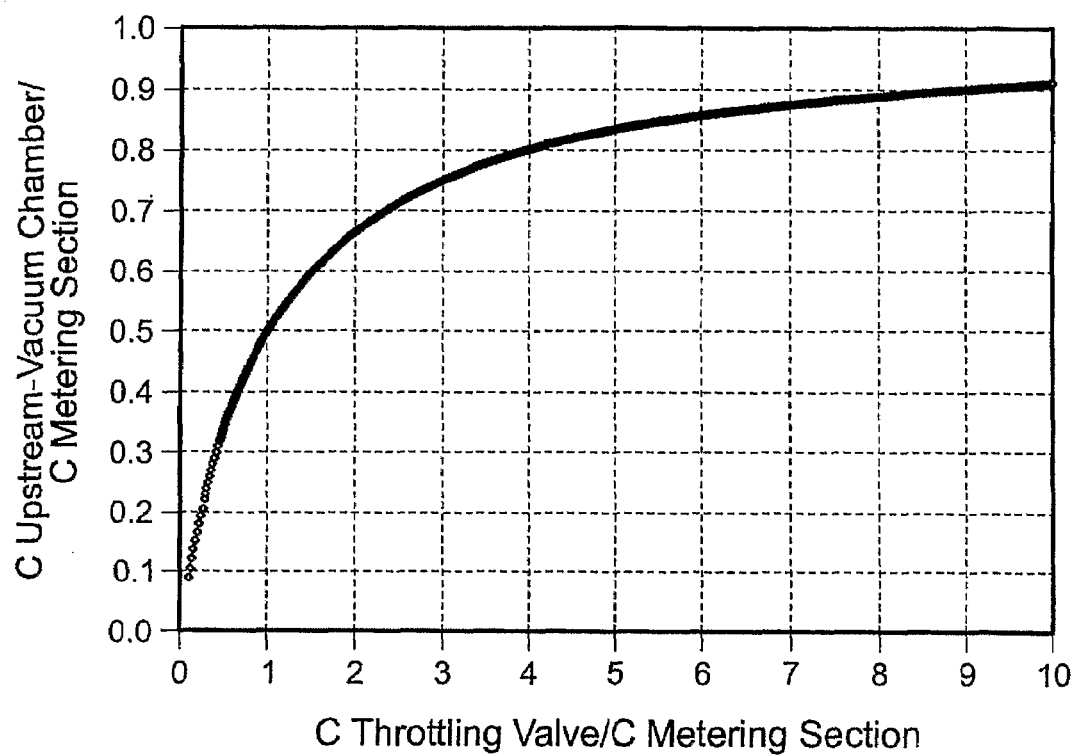
FIG. 2 plots calculated effective conductance from vaporizer outlet to vacuum chamber as a function of maximum throttle valve conductance.

This equation, plotted in FIG. 2, can be used to estimate the appropriate maximum conductance of the throttling valve to achieve a desired dynamic range for the delivery system. For example, FIG. 2 shows that if $C_{ThrottlingValveMaximum} = C_{MeteringSection}$ then the maximum attainable overall conductance is only ½ of the metering length conductance (i.e. conductance of the vapor conduit 32). When operating with vaporized materials where it is advantageous to reduce the working vapor pressure, (and thus the vaporizer temperature as in the present invention), then a ratio of $C_{ThrottlingValveMax}$ to $C_{MeteringLength}$ of at least about 5:1 or even 10:1 or higher is advantageous to maximize vapor flow dynamic range for a given metering length conductance.

FIG. 3 shows, in cross section, an ion source appropriate for creating decaborane or octadecaborane ions in an ion implanter. It differs from FIGS. 1A and 1B in depicting a butterfly-type of mechanical throttle valve 100' rather than using a gate valve 100 as the throttle valve as shown in FIG. 1A.

In the example of butterfly-type throttle valve 100' shown in the figure, the movable element is a circular flow-obstructing disc of size closely fitting a cylindrical passage, and mounted to be rotated about a diameter of the disc that lies perpendicular to the axis of the passage. It presents a vapor path of controlled conductance, see FIGS. 7A, 7B and 7C.

The vapor path from vaporizer to ionization chamber is clearly shown. The vapor conduit 150 of FIG. 3 performs the same function as the vapor conduit (metering section) 32 of FIGS. 1, 1A and 1B. In this source, solid borohydride material 140 (such as decaborane or octadecaborane, for example) is heated by vaporizer 145 to sublimate vapor 165 which passes through vaporizer exit port 155, through butterfly-type throttle valve 100', through isolation valve 160, through vapor conduit 150, and into ionization chamber 170 where vapors are ionized by electron beam 175. An extraction electrode (not shown) at an electric potential much different from that of the ion source extracts and forms an ion beam 180 through a vertical slot 185 in the front plate 190 of the ionization chamber 170.

Figure 4:
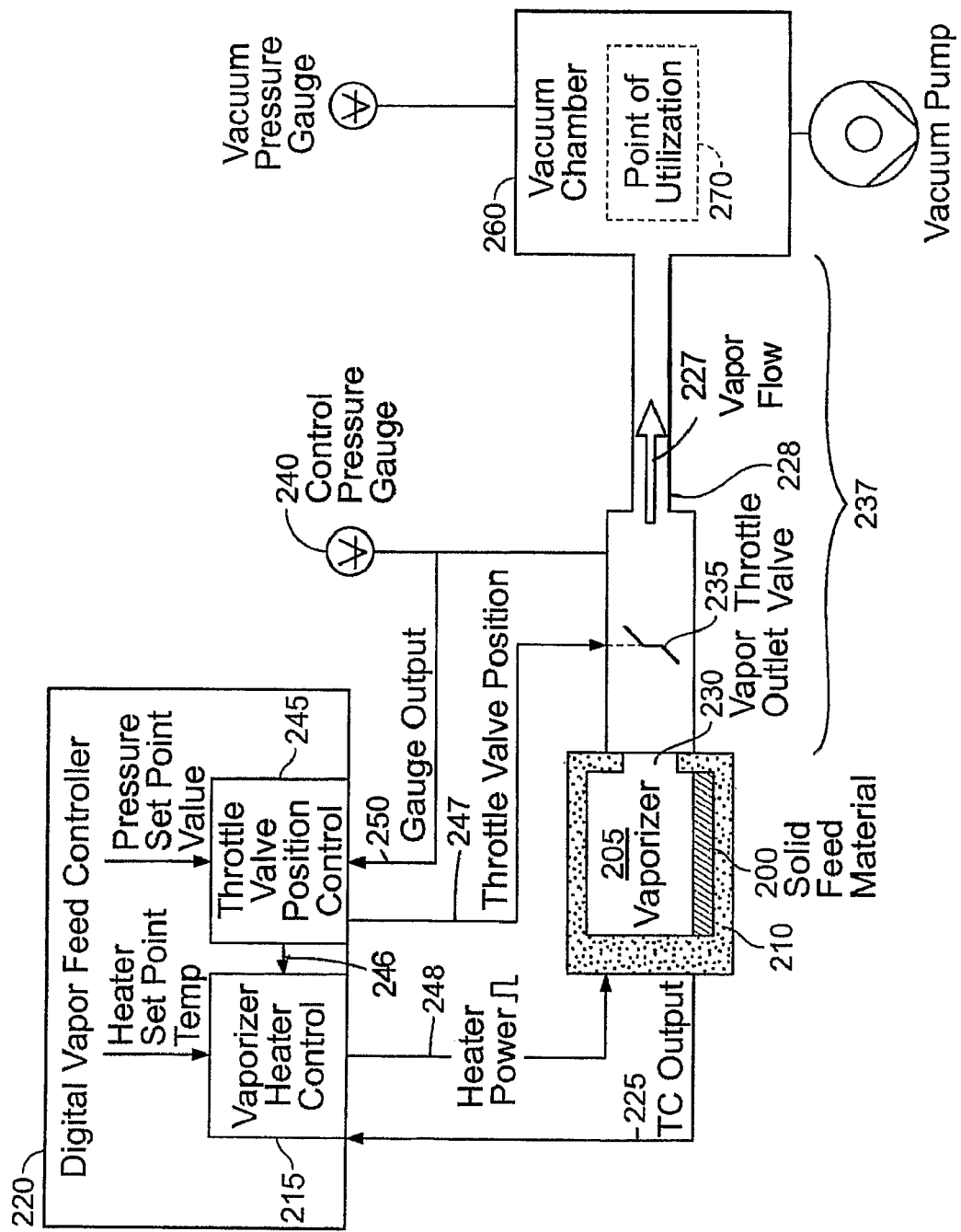
FIG. 4 shows, in block diagram, a system employing control set-points for producing an accurately controlled flow of sublimed vapors from a solid feed material into a vacuum chamber.

FIG. 4 illustrates, in greater detail, one embodiment of the invention designed to provide vapor flow into a vacuum chamber 260 to a point of utilization 270. A vacuum process may be conducted, for example, a chemical vapor deposition (CVD) process or low-pressure CVD (LPCVD) process, or other process where thin films are deposited on a work piece, for example boron-containing thin films such as boron nitride. Solid feed material 200 residing in vaporizer 205 is held at a well-defined temperature by heating vaporizer housing 210 to a temperature T above room temperature. Resistive heaters contained within vaporizer housing 210 are actively controlled by vaporizer heater control 215 within a digital vapor feed controller 220. Vaporizer heater control 215 incorporates a closed-loop PID controller (such as an Omron model E5CK-AA1-500, for example), which accepts a set-point temperature from digital vapor feed controller 220 and closes the loop on the temperature readback provided by a thermocouple (TC) output 225 embedded in vaporizer housing 210, and provides variable power 248 to the resistive heaters, for example in the form of a pulse width-modulated heater voltage. Vapors produced from the feed material 200 pass through vaporizer outlet 230 upstream of throttle valve 235. The purpose of throttle valve 235 is to reduce the vapor flow downstream of the valve such that pressure gauge 240 reaches a particular set-point pressure value. This set-point pressure value is provided by digital vapor feed controller 220 to a closed-loop throttle valve position control 245, which servos throttle valve 235 to a mechanical position (by sending a position signal 247 to a motor incorporated into the throttle valve assembly), in which the gauge output 250 equals the set-point value, i.e., the throttle valve position control 245 closes the loop on gauge output 250. The two set-point values, heater set-point value and pressure set-point value, are provided to digital vapor feed controller 220 either manually through a user interface, or by coded recipes which provide increased automation capability. In the case where throttle valve 235 comprises a butterfly valve, such as a Nor-Cal model 040411-4, a throttle valve position control such as provided by Nor-Cal model APC-200-A may be used. All surfaces with which the vapors come in contact are heated at least to the vaporizer temperature, or somewhat higher. Thus, throttle valve 235 and pressure gauge 240 are heated, as well as the passage walls, including those of metering section 232. A temperature of between 100 C and 150 C is adequate to prevent condensation of feed materials typically used in vaporizer 205. Typical vaporizer temperatures when running decaborane in the configuration shown in FIG. 4 is in the range 25 C to 40 C, while for octadecaborane it is between 80 C and 120 C, for example. Thus, a heated capacitance manometer such as an MKS Baratron model 628B-22597 or 631A-25845 may be used as pressure gauge 240. Such a gauge can read pressures in the range of a few milliTorr to a few Torr, and are appropriate for this application. In a particular case, gauges configured from the manufacturer to read a maximum pressure (full scale reading) of either 100 mTorr or 500 mTorr can be used. Such pressure limits are selected to provide excellent signal-to-noise for control gauge readings of between 20 mTorr and about 100 mTorr (signals near the bottom of range tend to be noisy, potentially making the servo loop less stable).

The appropriate set-point pressure value is determined by the desired partial pressure of vapors in vacuum chamber 260, and the vapor conductance between throttle valve 235 and vacuum chamber 260.

FIG. 5 shows a process in which vapor flow 227 impinges on a semiconductor work piece 280, in a vacuum environment. Such a process might be a thin film-deposition process, for example the production of polysilicon films or silicon-germanium films, in which dopant-containing vapors allow P-type or N-type doping of the semiconductor films during film growth. Another important application is plasma doping (PLAD). In PLAD, the substrate is held on a platen electrically isolated from the vacuum chamber, dopant vapors are introduced and a plasma is formed adjacent the platen. One or more high voltage pulses are applied to the platen, and hence the substrate, causing energetic ions of the plasma to be attracted to dope the substrate.

Figure 6:
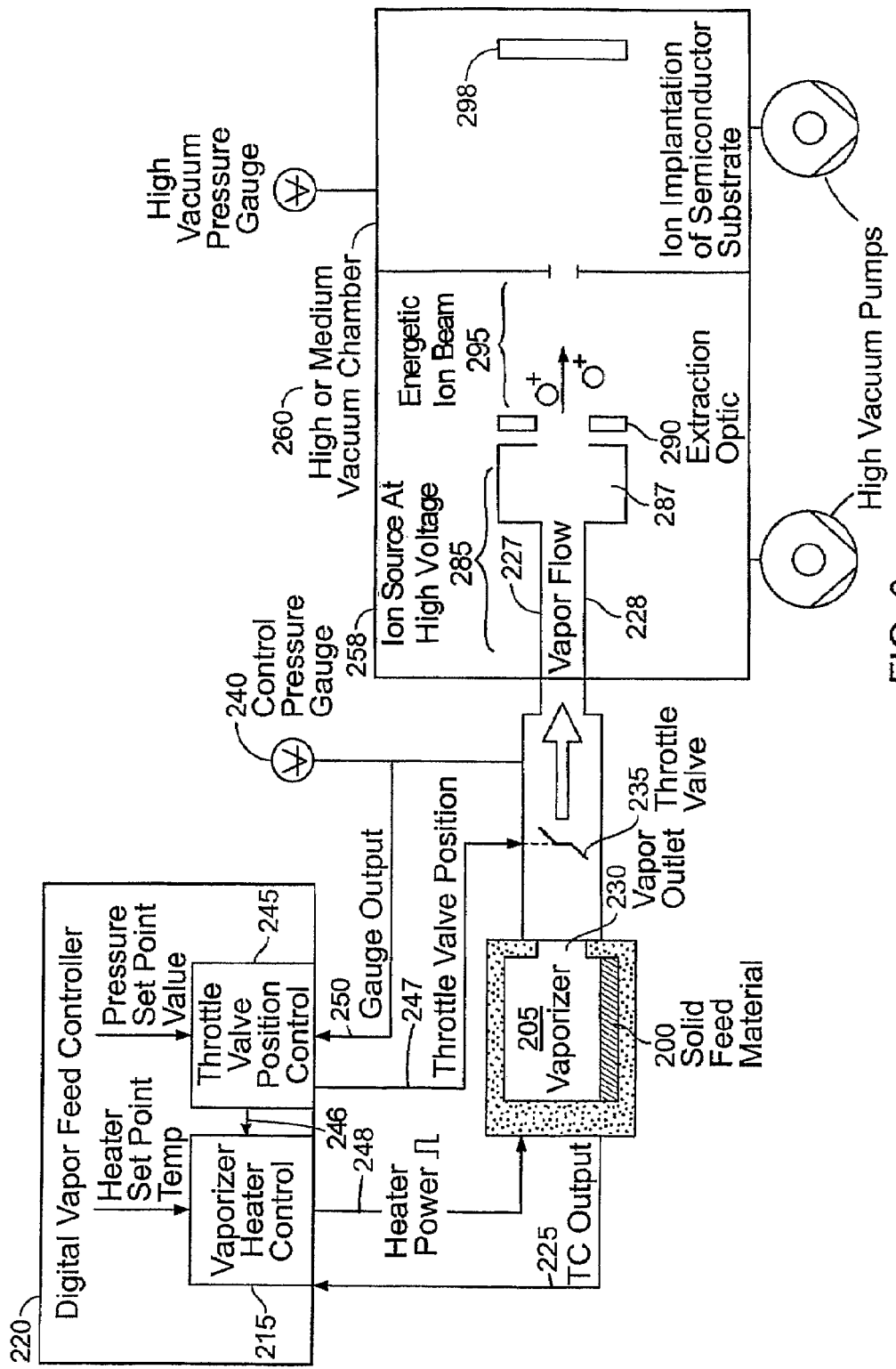

FIG. 6 shows a system in which vapor is fed into an ion source for forming an ion beam to perform ion implantation. Vapors pass through throttle valve 235, through vapor conduit 228 of ion source 285 and into the ionization chamber 287 of ion source 285. The ionization chamber 287 is held at high voltage. The vapor is ionized within ionization chamber 287 by an appropriate energizing means; once ions are created, they are extracted into an evacuated chamber, accelerated and formed into an energetic ion beam 295 by extraction optic 290, which is at a substantially different voltage from that of the ionization chamber. The ion beam is directed into an implantation chamber to implant a semiconductor substrate 298 for doping. The process can be the ion implantation into polysilicon coatings on large glass panels for making flat panel displays (FPD doping), for example. The ion beams produced by such systems may be mass analyzed, but frequently have no mass analysis. The ion source is typically quite large, its ionization chamber having one dimension somewhat larger than the shorter dimension of a panel being implemented, which can be a meter long or greater. In typical systems, a stationary "ribbon" beam of ions is extracted from the ion source and focused onto the flat panel, while the panel is mechanically scanned across the beam along the longer dimension of the panel. This process is important in fabricating FPD's which have CMOS driver circuitry along the periphery of the display panels, for example in making thin film transistor-based televisions or computer monitors.

Figure 7:
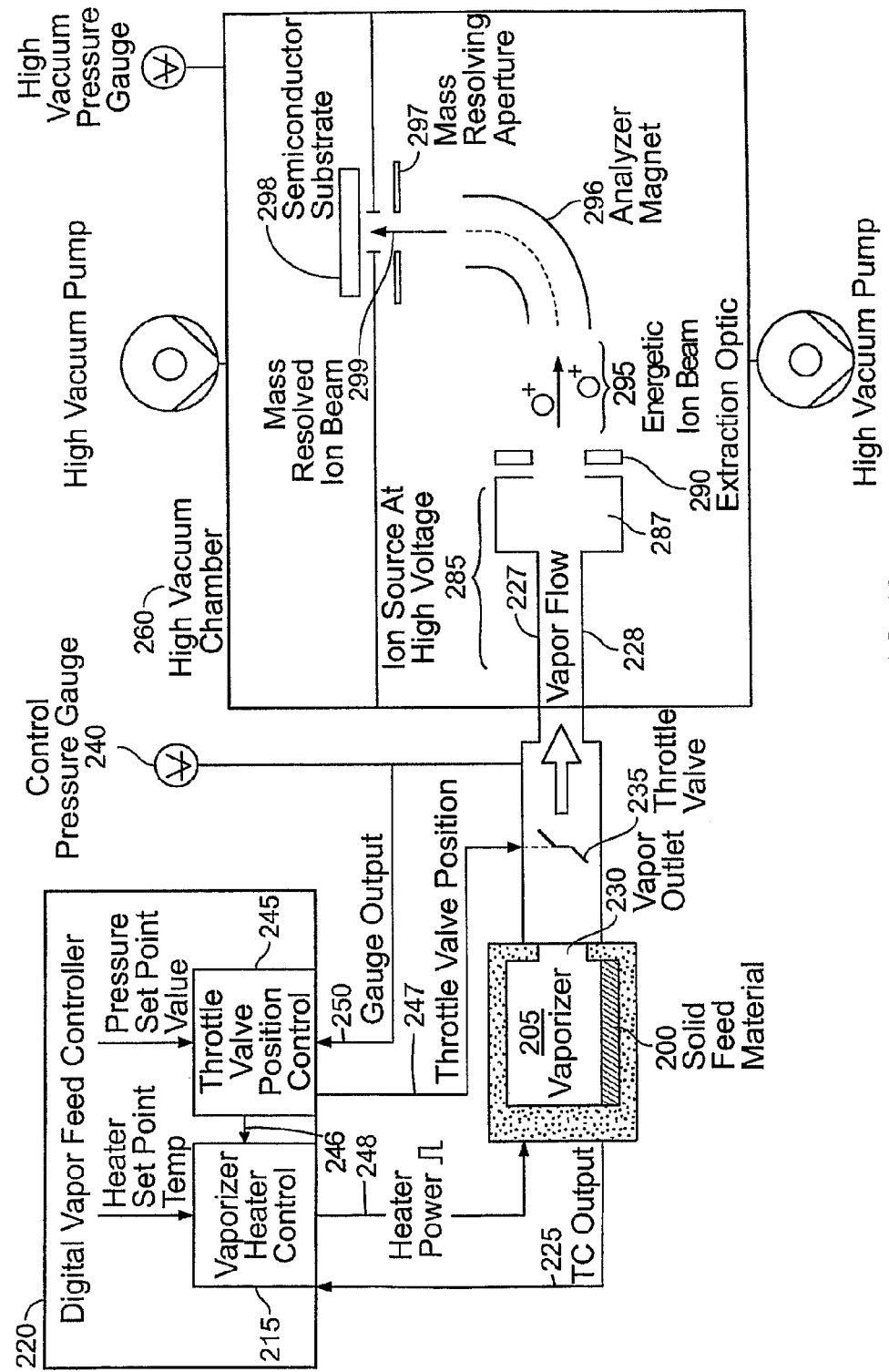

FIG. 7 shows a system adapted to the case of a conventional beamline ion implanter having mass analysis. After the ion beam 295 is extracted from ion source 285 by extraction optic 290, the beam passes into a dispersive dipole electromagnet which separates the unresolved beam 295 into beamlets separated in space according to the mass-to-charge ratio of the ions, as is known in the art. The electromagnet current, and hence the bending, dispersive dipole field, can be adjusted so that only ions of a particular mass-to-charge ratio (or a certain preferred range of mass-to-charge ratios, depending on the width of resolving aperture 297) are passed to the semiconductor substrate by resolving aperture 297.

For implanting ions into a semiconductor wafer (e.g. a silicon crystal) the ionization chamber 287 has a volume less than about 100 ml and the maximum flow of sublimated vapor into the chamber is of the order of 1 sccm.

Figure 7C:
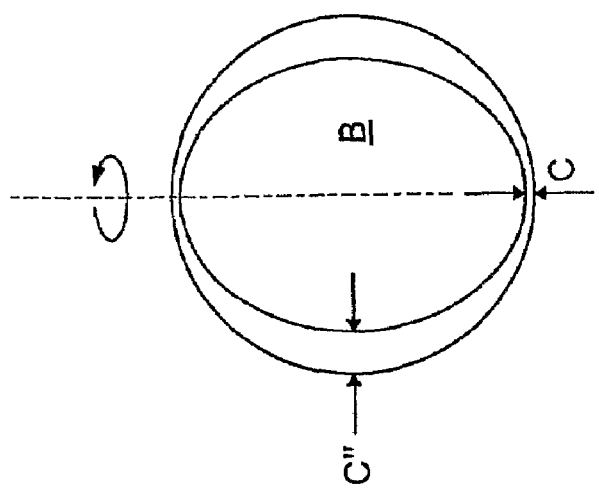
FIGS. 7A, 7B and 7C illustrate, in diagrammatic form, clearances of a throttle valve of a butterfly type when closed, and when in lower and upper regions of a useful range.
Figure 7B:
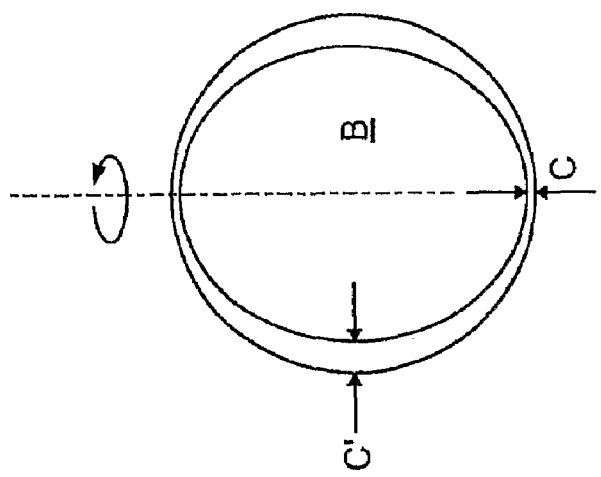
Figure 7A:
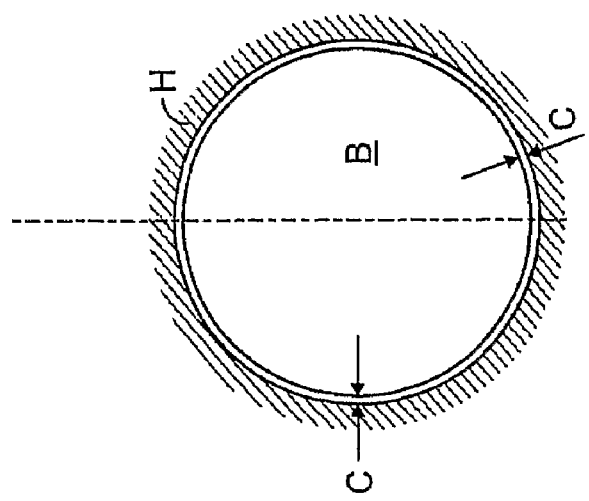
Figure 7D:
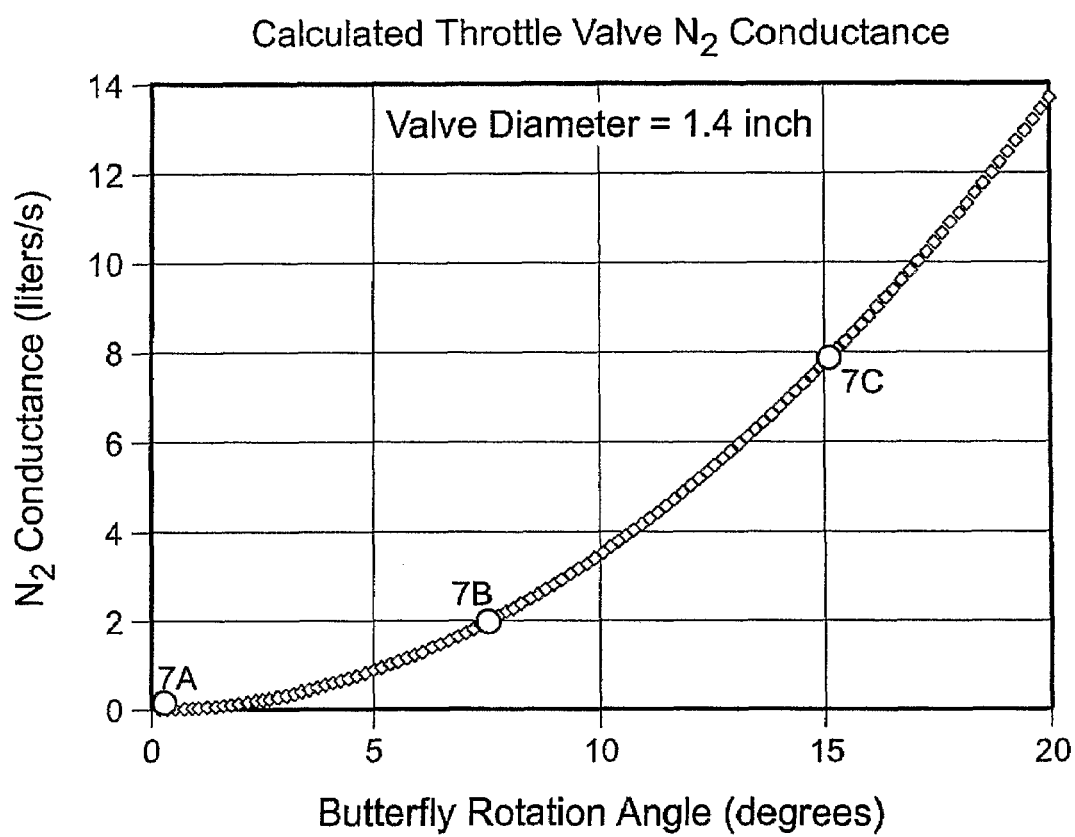
FIG. 7D shows the calculated $N_2$ conductance of the 1.4 inch throttle valve used for producing FIGS. 10, 11, and 12.

FIGS. 7A-7C illustrates, in qualitative manner, relative positions of the butterfly valve roughly corresponding as follows: in FIG. 7A: closed position; FIG. 7B: 7.5 degree rotation; FIG. 7C: 15 degree rotation. The rotary positions are controlled electrically by a rotary stepper motor. Clearances between the periphery of rotatable circular plate B of the butterfly and its cylindrical housing H are indicated by C<C'<C", where C is the minimum clearance in the "closed" position, of a few thousandths of an inch. FIG. 7D shows calculated $N_2$ conductance as a function of rotation angle for a circular butterfly of 1.4 inch diameter. The points corresponding to FIGS. 7A-7C are marked on the curve of FIG. 7D, and are approximately equal to ~0 l/s, 2 l/s, and 8 l/s, respectively.

Figure 7G:
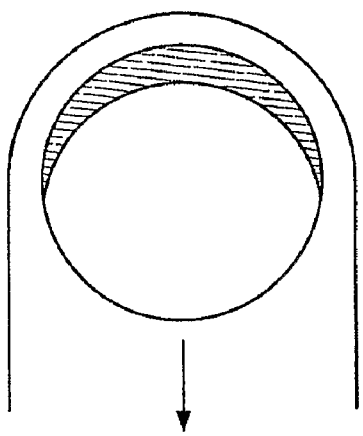
FIGS. 7E, 7F and 7G illustrate clearances of a throttle valve of a gate type when closed, when 10% open, and when 30% open.
Figure 7F:
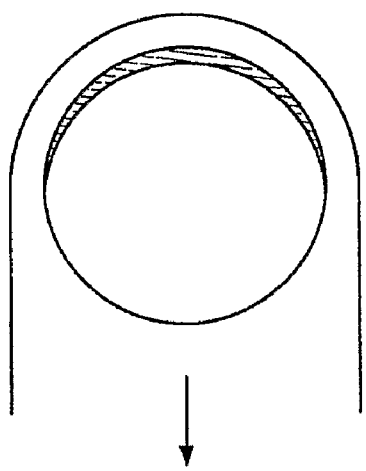
Figure 7E:
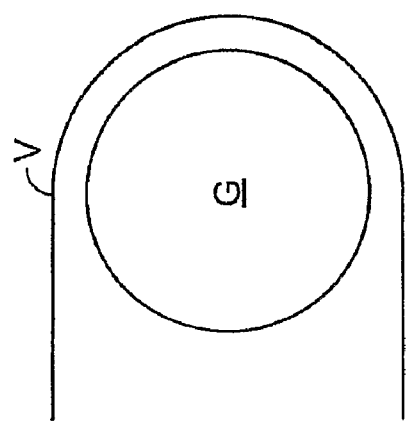

FIGS. 7E-7G illustrate, in qualitative manner, relative positions of a sliding gate valve implemented as a throttle valve, see FIGS. 1A and 1B. Shown are: FIG. 7E: gate G in closed position; FIG. 7F: gate G 10% open; FIG. 7G: 30% open. The gate valve, available in a variety of diameters from about 0.5 inch to 2.5 inches, functions as both a shutoff valve (seals when closed) and a throttle valve (with a stepper motor operating the valve actuator). The butterfly valve is not a sealing valve; i.e., it has a small but finite conductance when closed.

Figure 8:
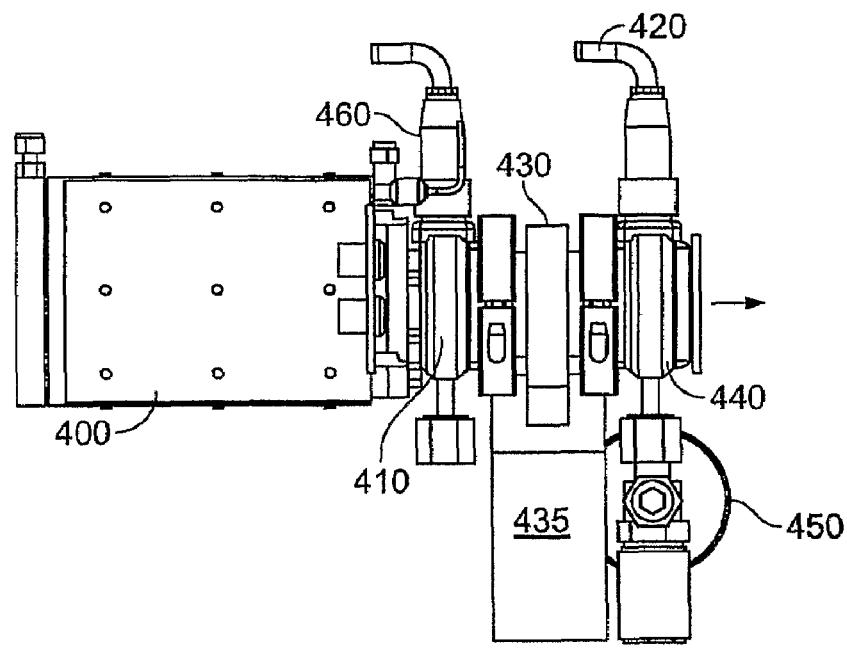
FIGS. 8 and 8A are top and side views of a preferred embodiment of the vapor delivery system of the present invention for delivering feed vapors to the ion source of an ion implanter.
Figure 8A:
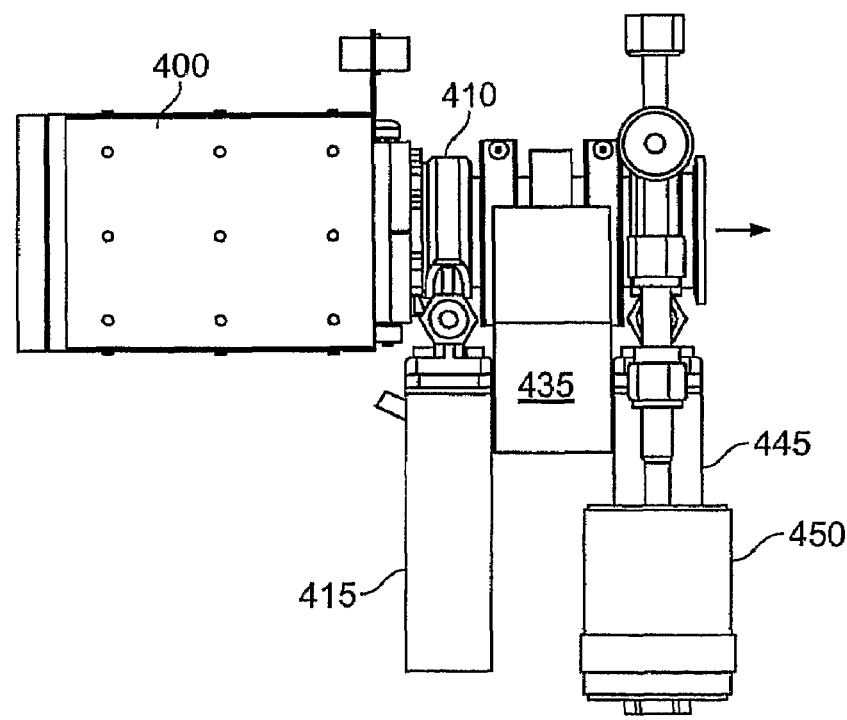

FIGS. 8 and 8A show two views of a preferred embodiment of a vapor delivery system for providing vapors to the ion source of an ion implanter, for example the source of FIG. 3. The overall length of the valve chain is minimized, and is designed to be close-coupled to the ion source. Shown is vaporizer 400, vaporizer isolation valve V1, 410, valve actuator 415, evacuation port 420 (connects to V3, not shown), throttle valve TV1, 430, throttle valve motorized actuator 435, ion source isolation valve V2, 440, V2 actuator 445, heated capacitance gauge G1, 450, $N_2$ vent valve V4, 460.

Figure 9:
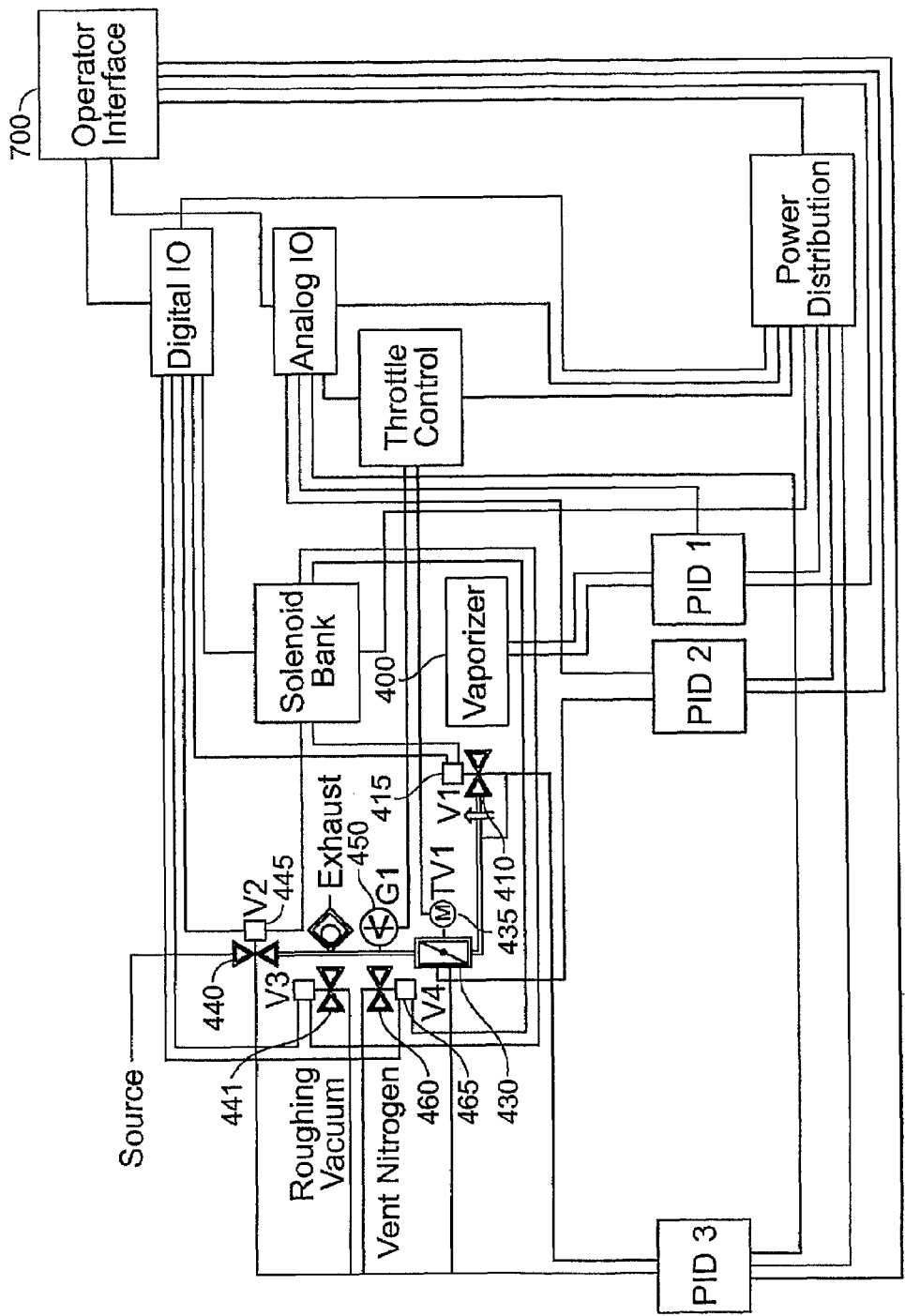
FIG. 9 shows a schematic of the vapor delivery system of FIG. 8, indicating the salient control points for an implementation of the invention.

FIG. 9 shows a schematic of the vapor delivery system of FIG. 8, indicating the salient control points. The vapor delivery system is depicted controlled through an operator interface 700, through which the operator can provide inputs to open or close valves V1, 410 (vaporizer isolation valve), V2, 440 (ion source isolation valve), V3, 441 (roughing vacuum valve), V4, 460 (vent valve), and TV1 430 (throttle valve); all of these valves provide readbacks to the operator interface to confirm the valve states. V3 is located between the two isolation valves V1 and V2, and is opened when it is necessary to evacuate the dead volume between these two valves, for example after the vaporizer 400 has been removed (with V1) for service or refill and replaced. In the same manner, V4 is used to vent this dead volume to prepare for component removal, for example removal of the vaporizer 400. Other user-accessible inputs include three temperature setpoints: PID 1 for the vaporizer 400, PID 3 for valves V1-V4 and TV1, and a temperature set-point for the ion source block containing the vapor conduit 150 of FIG. 3. In general, all surfaces with which the vapor comes in contact are maintained at a temperature at least as high as that of the vaporizer. It is preferable to maintain ion source set-point temp>PID 3>PID 1. Via the ion source block, the surfaces of conduit 150 are thus preferably maintained at temperature greater than the set-point of PID 3. PID 2 is a closed-loop controller which adjusts the position of the throttle TV1, 430 to bring the pressure read by pressure gauge G1, 450 to its set-point value. This pressure set-point for the heated pressure gauge G1, 450 reads back to the Operator Interface. This pressure readback signal indicates the vapor pressure between throttle valve TV2 and the vapor conduit to the ion source (vapor conduit 150 in FIG. 3), providing the control signal for the closed-loop control of TV1 position. Since the flow rate of vapor through vapor conduit 150 into ionization chamber 170 of the ion source is approximately proportional to this inlet pressure, then providing a stable and reproducible inlet pressure by means of PID 2 enables a stable and well-defined pressure within ionization chamber 170, which in turn enables a very stable ion current to be extracted from the ion source.

Figure 10:
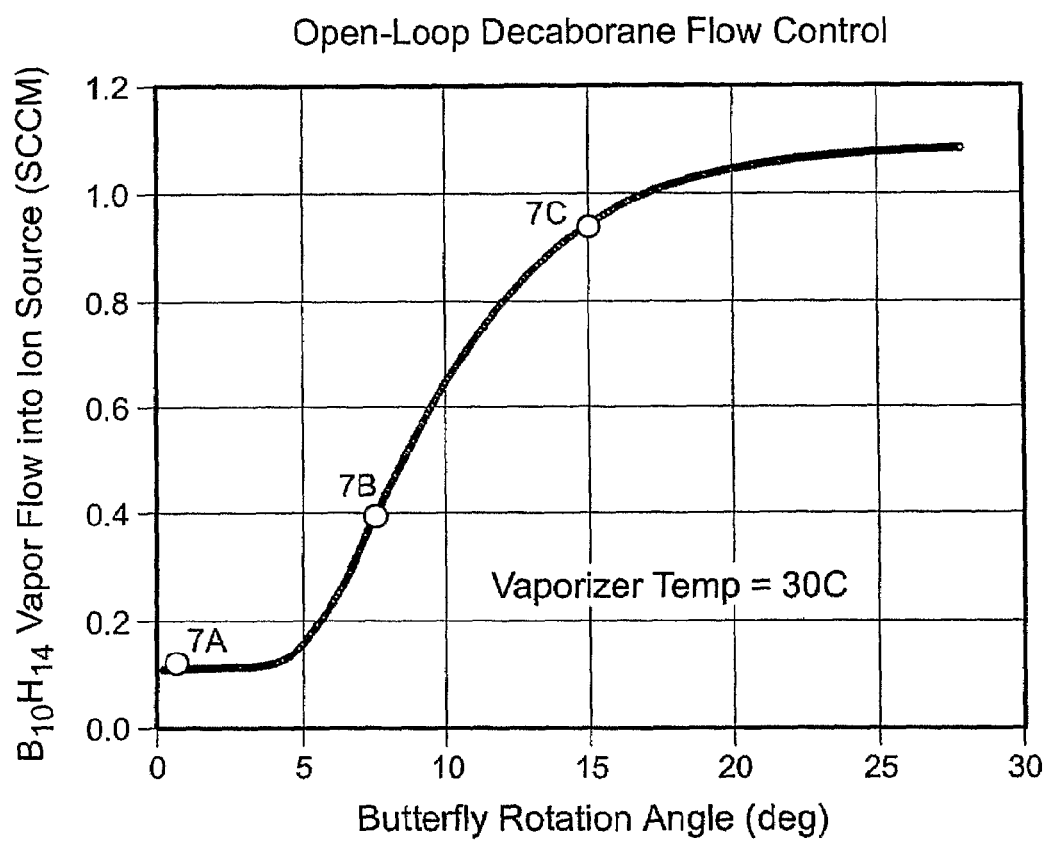
FIG. 10 graphs flow of vapors from a vaporizer through the throttle valve of the embodiment of FIGS. 8 and 9 into an ion source, under open loop conditions and at fixed vaporizer temperature, using the semiconductor dopant solid feed material decaborane.

FIG. 10 is a plot of decaborane vapor flow into the ion source of FIG. 3 using the vapor delivery system of FIG. 9. The butterfly-type throttle valve positions outlined in FIGS. 7A, 7B, 7C are shown on the curve of FIG. 9. The useful dynamic range of the vapor delivery system covers about a factor of 10, from about 0.1 sccm (standard cc's per minute) to over 1.0 sccm for a vaporizer temperature of 30 C, which delivers a fixed vapor pressure upstream of the throttle valve. To obtain higher flows, a higher vaporizer temperature is used. Typical gas flow rates consumed by ion sources for ion implanters are about 2 sccm or less. Thus, the vapor delivery conductances and pressures are tuned to the required vapor flows, and to the conductance of the ion source inlet, as shown in FIG. 2 and accompanying text, and will be further expanded in a discussion of FIG. 12.

Figure 11:
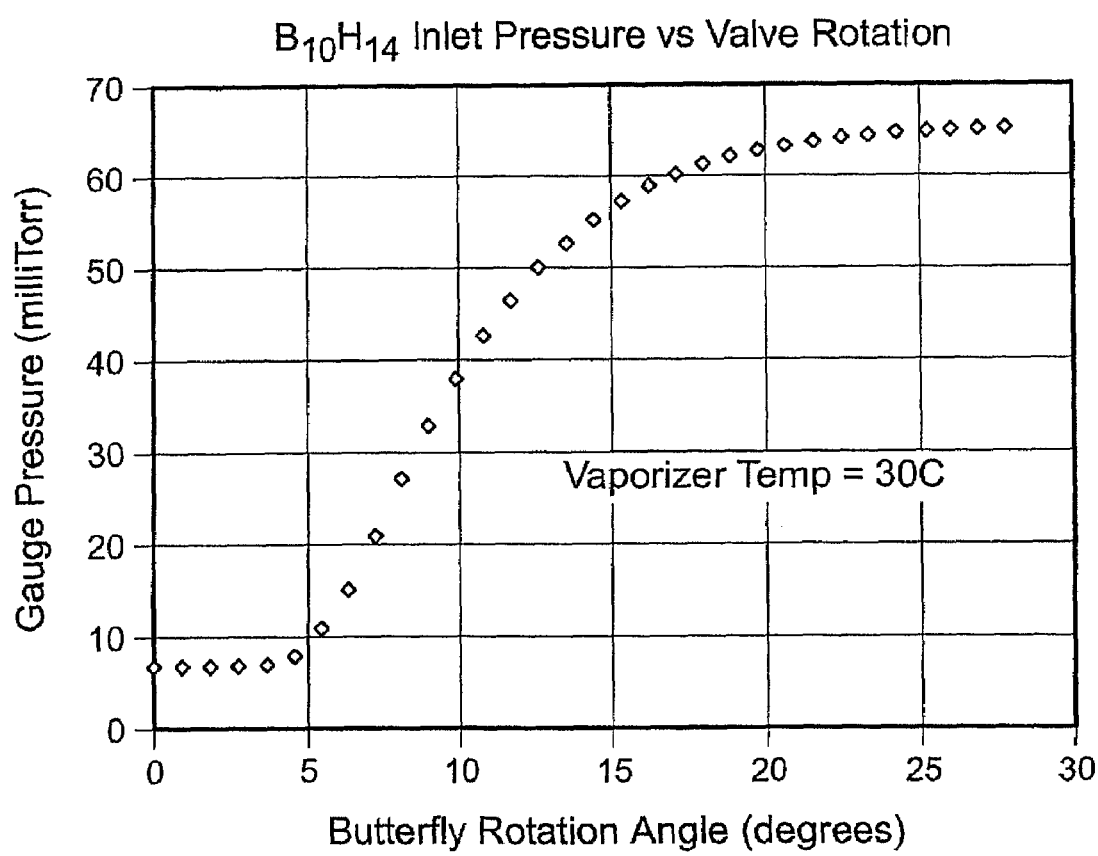
FIG. 11 shows the control pressure gauge pressure immediately downstream of the throttle valve as a function of butterfly rotation angle, for the configuration of FIGS. 8 and 9.

FIG. 11 shows the response of the control pressure gauge 450 to throttle valve rotation in the system exemplified by FIGS. 3 and 8-10. The vapor pressure within ionization chamber 170 at about 40 mTorr gauge pressure (i.e., pressure at the inlet to the ion source) is about 1 mTorr, while the pressure upstream of the throttle valve (the outlet of the vaporizer) is about 65 milliTorr. Thus, the greatest pressure drop is across the vapor conduit 150 of the ion source of FIG. 3, which for the example has an $N_2$ conductance of about 0.5 l/s.

Figure 12:
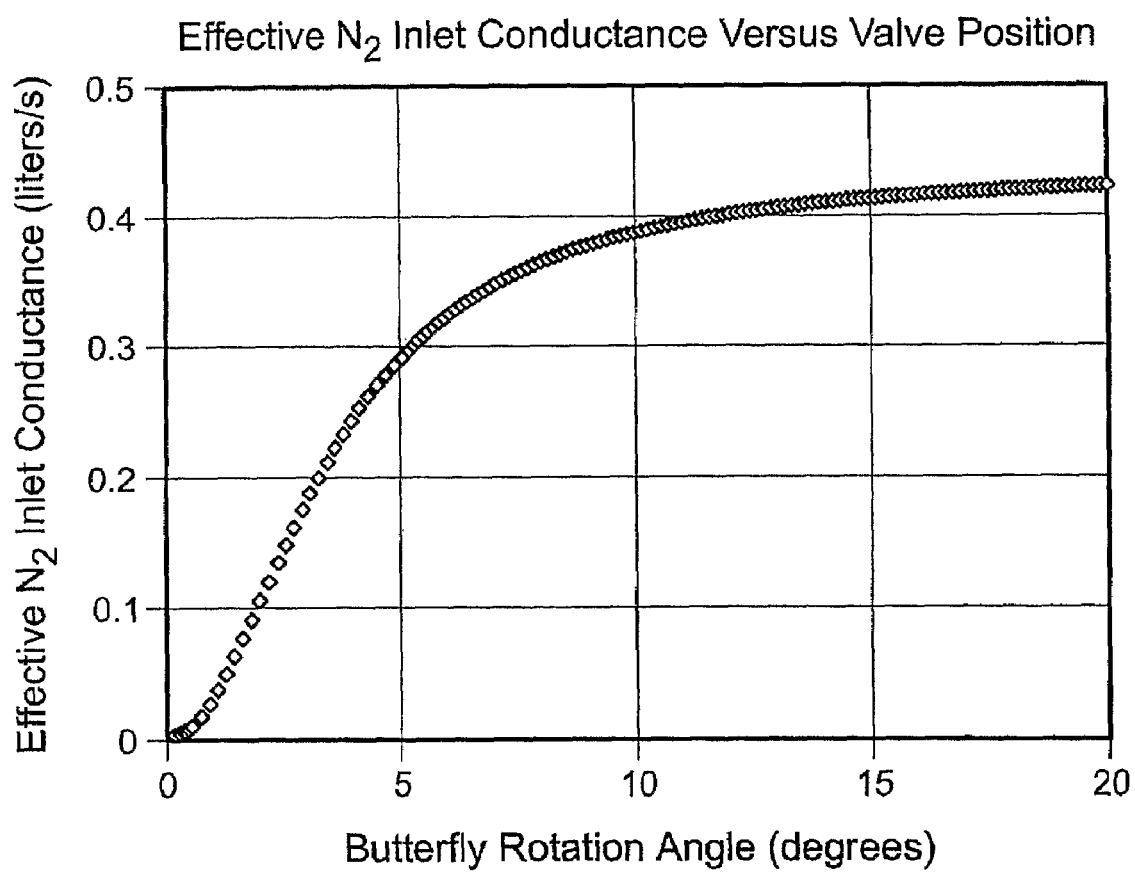
FIG. 12 shows the effective $N_2$ conductance (in liters per second) of the vapor delivery system of FIGS. 8 and 9.

FIG. 12 plots the effective $N_2$ conductance of the entire vapor delivery chain of FIGS. 3 and 8-10 as a function of rotation angle of a butterfly-type throttle valve. When the throttle valve is open, the overall conductance of the system is nearly equal to the conductance of the vapor conduit 150 of the ion source. The conductance dynamic range of the throttle valve should be matched to the smallest conductance of the system, in this case the conductance of the conduit 150 into the ion source. The vapor conduit 150 of FIG. 3 for the example is a cylindrical bore about 1 cm in diameter and 25 cm long. For a larger or smaller conductance ion source inlet conduit, a respectively larger or smaller throttle valve (one with a respectively larger or smaller conductance over its dynamic range) should be used. The vapor delivery system herein disclosed enables use of "open" valve and passage structures (high conductances) which are not easily clogged by condensed vapors. In addition, all the valves and connecting elements are readily held at a temperature greater than the vaporizer temperature. For example, referring now to FIG. 9, for operation with decaborane the vaporizer is maintained at 30 C, V1-V4 and TV1 are at 50 C, gauge G1 is at 100 C, and the ion source is held at >50 C. This "staging" of the temperatures of successive elements down the chain prevents any significant condensation of sublimed vapors. Importantly, the use of high-conductance elements following the vaporizer minimizes the vapor pressure and hence the vaporizer temperature required to reach and sustain the desired flow rates. This increases the useful life of the borohydride or other solid feed materials stored in the vaporizer, since they are known to dissociate or polymerize at elevated temperatures with reactions that are a strong function of temperature.

Over a desirable range of implementations, the maximum $N_2$ gas conductance of the throttle valve is at least 1 liter per second or greater, and the pressure drop across the throttling valve when the valve is fully open is less than 100 mTorr, in preferred cases often less than 25 mTorr.

Figure 13:
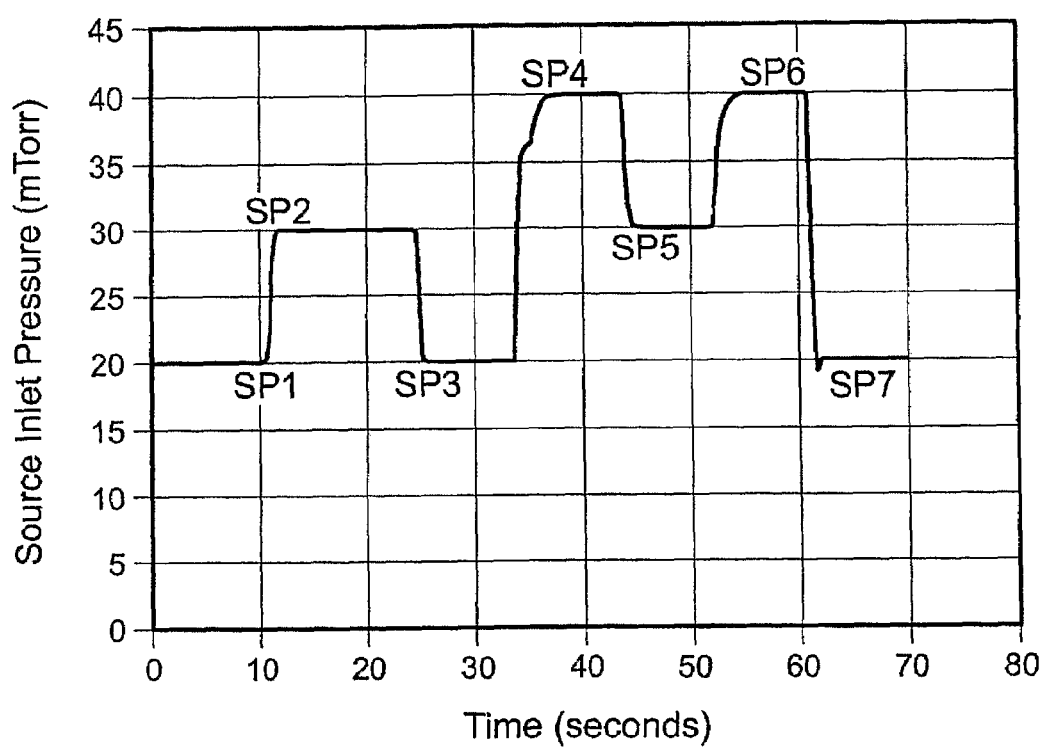
FIG. 13 shows the step response of the vapor delivery system of FIGS. 8-12 as set-point pressure is changed.

All of the previous FIGS. 10-12, for explanation purposes, show so-called "open loop" operation of the throttle valve, i.e., in which the valve position is set as an independent variable. FIG. 13 shows the time signature of the vapor delivery system when operated in its normal "closed-loop" mode. In this mode, referring now to FIG. 7, a pressure set-point is provided by digital vapor feed controller 220 to throttle valve position control 245. The position control adjusts the valve position to minimize the "error" between control gauge output 250 and the pressure set-point value. This is accomplished by a so-called PID (Proportional Integral Differential) control loop which can be programmed to have well-defined response characteristics such as speed and settling time, and degree of overshoot, for example. The Nor-Cal model APC-200-A incorporates such a PID controller, coupled to a stepper motor which turns the shaft to which the circular plate of the butterfly throttle valve is mounted. (It should be pointed out at this juncture that the butterfly throttle valve used in this example was designed by its manufacturer for a fundamentally different application, namely a downstream pressure control application, throttling the pumping speed at the vacuum chamber, while the present invention uses this hardware for "upstream" control, the introduction of gases into a vacuum chamber. Similarly, the use of a sealing gate valve under motorized control to accomplish upstream throttle control is believed novel.) For generating the time signature of FIG. 13, three different pressure setpoints (20 mTorr, 30 mTorr, and 40 mTorr) were input through a graphical user interface into the digital vapor feed controller 220 at random, with intervals of about ten seconds to generate the data. FIG. 13 shows the rapid settling time and excellent reproducibility of this system when using octadecaborane ($B_{18}H_{22}$) feed material. Referring in detail to FIG. 13, at Time=0 sec the control pressure read 20 mTorr; at T=10 sec a set-point (SP1) of 30 mTorr was input into controller 220 by the operator; at T=25 sec a set-point (SP2) of 20 mTorr was input, and so on, up to SP7. The "step response" characteristic recorded in FIG. 13 indicates that settling times of the pressure are typically only a few seconds, stability is very good, and overshoot minimal.

Figure 14:
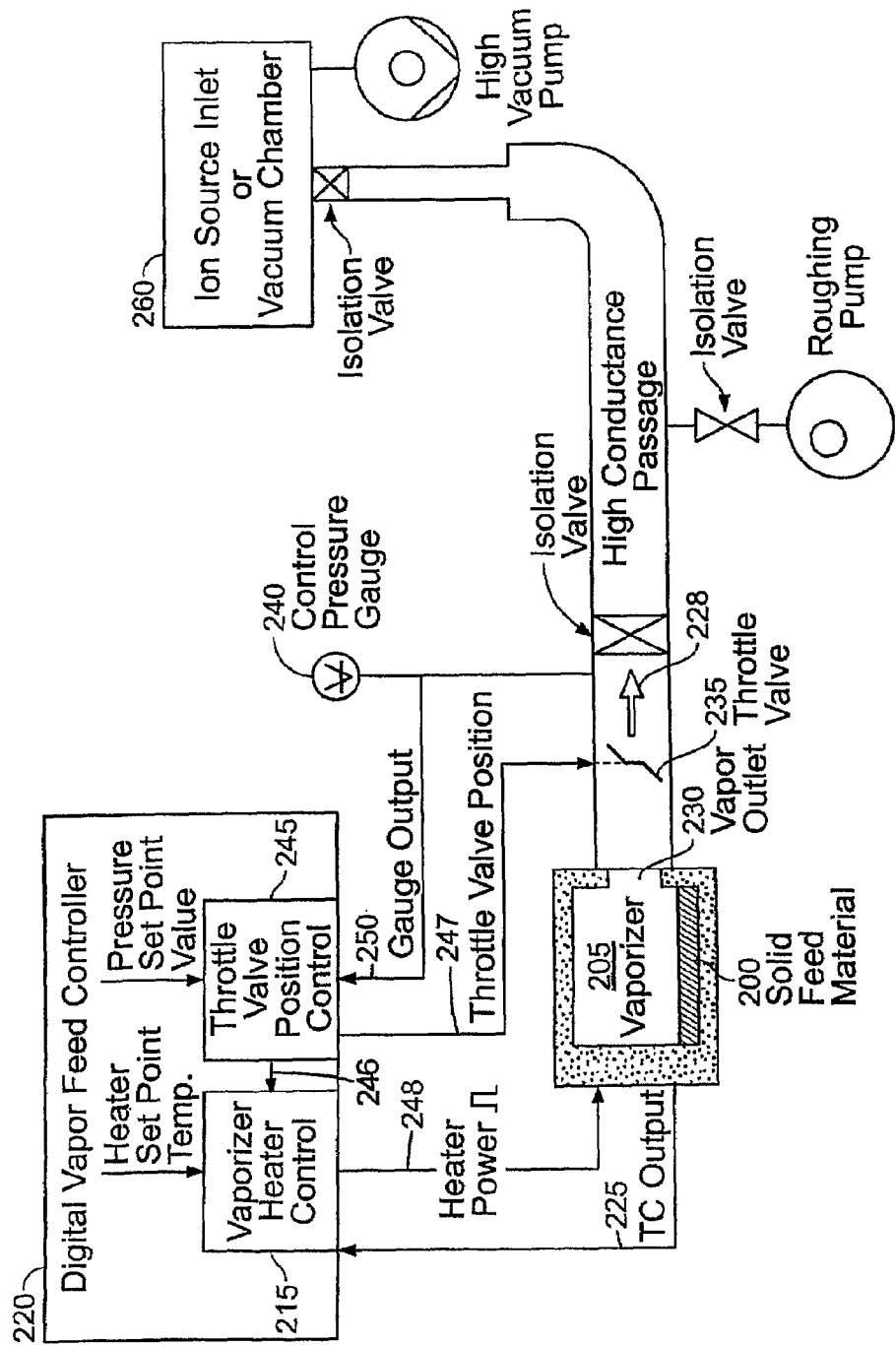
FIG. 14 illustrates a remote implementation of the vapor delivery system.

FIG. 14 illustrates a remote implementation of the vapor delivery system of FIGS. 4-7, for example the vaporizer, throttle valve, and other flow control elements are located in the gas distribution box of an ion implanter, requiring a connecting tube of up to a meter long to connect to the inlet to the ion source. By using large-diameter tubing (at least 1 inch diameter), the overall conductance of the vapor delivery chain is not significantly reduced, and remains dominated by the ion source's vapor inlet conductance in accordance with FIG. 2.

Figure 15:
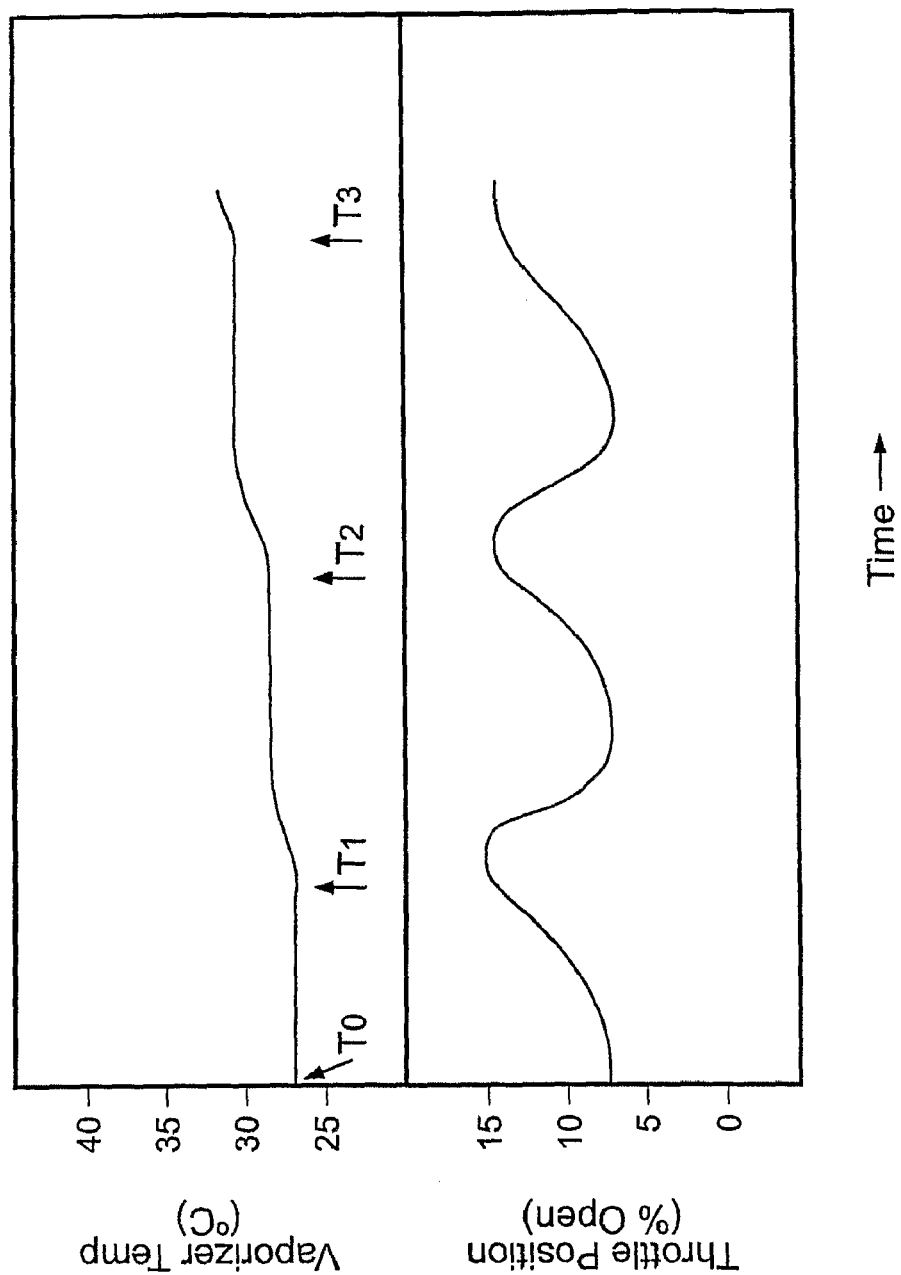
FIG. 15 illustrates valve position over time as solid feed material is consumed, in the case where the vaporizer temperature is periodically updated to accommodate the dynamic range of the throttle valve.

FIG. 15 illustrates further important feature of the vapor delivery system. It is known that the rate at which feed material vaporizes is a function of its open surface area, particularly the available surface area at the solid-vacuum interface. As feed material in powder form within the vaporizer is consumed over time, this available surface area steadily decreases, resulting in a decrease in the vapor pressure preceding the throttle valve until the evolution rate of vapors cannot support the desired vapor flow rate. This is known as "evolution rate limited" operation. Thus, with a fresh charge of a given feed material in the vaporizer, a vaporizer temperature of, say, 25 C might support the required vapor flow at a nominal throttle valve position at the low end of its dynamic range, for example that represented by point 7B indicated on the curve of FIG. 10. After passage of time (for example, after 20% of the feed material is consumed), a valve position commensurate with point 7C indicated on the curve of FIG. 10 might then be necessary to maintain the same desired flow. The state of the system is now such that the throttle valve is near the high displacement limit of its dynamic range. By suitable provision, this displacement is sensed by the vapor feed controller 220. It sends a new, higher heater set-point temperature as by signal 246, FIG. 14, to vaporizer heater control (or regulator) 215. The vapor feed controller possesses resident lookup table information which determines the next incremental temperature change that would produce a desired increase of vapor generation and pressure increase preceding the throttle valve. For example, for nominal 30 C operation, the next increment could be 2 C, a change to 32 C. The increment is selected to restore, once the vaporizer temperature settles to its new value, the nominal throttle valve operating point to 7B of FIG. 10, near the low displacement end of its dynamic range. Thus, the ability of the digital controller 220 to accommodate both short-timescale changes in set-point vapor pressure and long-timescale changes in vaporizer temperature make the control of vapor flow over the lifetime of the feed material charge very robust.

A number of embodiments of the invention have been described. Nevertheless, it will be understood that various modifications may be made without departing from the spirit and scope of the invention. Accordingly, other embodiments are within the scope of the following claims.

What is claimed is:

1. A vapor delivery system for delivering a controlled flow of vapor sublimated from a solid material to a vacuum chamber, comprising the combination of a heated vaporizer for the solid material operable at sub atmospheric pressure and a vapor delivery passage from the vaporizer to the vacuum chamber, the vapor delivery passage including a throttle valve followed by a vapor conduit a pressure gauge that is responsive to sub atmospheric pressure being located between the throttle valve and the vapor conduit, a closed loop temperature control system for maintaining the surfaces of the vapor delivery passage that are exposed to the sublimed vapor, including such surfaces of the throttle valve, the pressure gauge and the vapor conduit at a temperature above the condensation temperature of the solid material, and a closed-loop pressure control system to vary the conductance of the throttle valve to control the sub atmospheric pressure of the vapor downstream of the throttle valve in response to the output of the pressure gauge, so that the flow of vapor to the vacuum chamber is a function of the pressure of the vapor in the region of the passage between the throttling valve and the vapor conduit.

2. The vapor delivery system of claim 1 including a temperature controlling system adapted to hold the temperatures of the surfaces of the delivery passage above the temperature of the vaporizer.

3. The vapor delivery system of claim 2 having multiple stages of the vapor delivery passage adapted to be held at progressively higher temperatures, the more distant the stages are from the vaporizer.

4. The system of claim 1 wherein the vapor flow rate is adapted to be determined by both a control system for the temperature of the vaporizer and said control system for the conductance of the throttle valve.

5. The system of claim 1 wherein the temperature of the vaporizer is determined by closed-loop control to a set-point temperature.

6. The vapor delivery system of claim 1 in which the maximum N2 conductance of the throttle valve is at least 1 liter per second.

7. The vapor delivery system of claim 1 in which the pressure drop across the throttle valve when the valve is operationally fully open is less than 100 mTorr.

8. The vapor delivery system claim 1 in which the maximum conductance, of the throttle valve is at least 5 times the conductance of the vapor conduit.

9. The vapor delivery system of claim 1 in which the maximum conductance of the throttle valve is at least 10 times the conductance of the vapor conduit.

10. The vapor delivery system of claim 1 in which said throttle valve is a variable-position gate valve.

11. The vapor delivery system of claim 1 in which said throttle valve is of the butterfly type.

12. The vapor delivery system of claim 11 in which the useful dynamic range of the butterfly valve, between lowest and highest conductance, is about a factor of 10.

13. The vaporizer delivery system of claim 1 constructed to operate with a rechargeable fixed charge of solid material which is progressively consumed in a manner to reduce the vapor-emitting area of the solid material, and constructed, in response to a decrease in pressure beyond the throttle valve, to reset the position of the throttle valve to recover the desired flow, and also from time to time, as the throttle valve nears its maximum useful conductance, to elevate the temperature of the vaporizer to raise the pressure in the vaporizer and enable the throttle valve to operate within its preferred conductance dynamic range.

14. The vapor delivery system of claim 13 in which said throttle, valve is of the butterfly type.

15. The vaporizer delivery system of claim 13 in combination with a throttle valve-based sensing and control system capable of providing a vaporizer set-point temperature value to a regulator of a vaporizer heater that is capable of maintaining the vaporizer temperature at the set-point, the sensing and control system storing at least one predetermined valve displacement value representing a desired upper conductance limit for the throttle valve, the sensing and control system constructed to monitor the position of the throttle valve, and upon detecting the valve nearing or reaching that displacement value, the sensing and controller system constructed to raise the set-point temperature value to the regulator heater to cause increased vapor generation and vapor pressure upstream of the throttle valve, thereby to enable the closed loop control of the throttle valve to cause the valve to return to a substantially lower conductance position.

16. The vapor delivery system of claim 15 in which said throttle valve is of the butterfly type.

17. The vaporizer delivery system of claim 15 including a reference table of predetermined increments of temperature rise suitable for operation, and the sensing and control system effective, upon detecting the valve nearing or reaching said displacement value, to cause the vaporizer temperature set-point to be incremented to the next step in the reference table.

18. The vapor delivery system of claim 1 constructed and arranged to deliver ionizable vapor to an ion source.

19. The vapor delivery system of claim 15 constructed and arranged to deliver ionizable vapor to the ion source of an ion implanter.

20. The vapor delivery system of claim 1 constructed and arranged to deliver vapor to a work piece processing vacuum chamber.

21. The vapor delivery system of claim 17 constructed and arranged to deliver ionizable vapor to a process chamber for dosing semiconductors.

22. The vapor delivery system of claim 1 constructed to convey its vapor to a high vacuum, the system constructed to respond to decrease in sub atmospheric pressure downstream of the throttle valve to increase the temperature of the vaporizer.

23. The vapor delivery system of claim 1 in which the control system for the throttle valve includes a servo loop which adjusts the position of the throttle valve in response to the output signal of the pressure gauge to maintain said downstream vapor pressure at said gauge to a set-point value.

24. The vapor delivery system of claim 1 in which the vaporizer is constructed to contain and evaporate decaborane, $B_{10}H_{14}$.

25. The vapor delivery system of claim 1 in which the vaporizer is constructed to contain and evaporate octadecaborane, $B_{18}H_{22}$.

26. A vapor delivery system for delivering a controlled flow of vapor sublimated from a solid material to a vacuum chamber, comprising the combination of a heated vaporizer for the solid material operable at sub atmospheric pressure and a vapor delivery passage from the vaporizer to the vacuum chamber, the vapor delivery passage including a throttle valve followed by a vapor conduit a pressure gauge that is responsive to sub atmospheric pressure being located between the throttle valve and the vapor conduit, surfaces of the vapor delivery passage that are exposed to the sublimed vapor, including such surfaces of the throttle valve, the pressure gauge and the vapor conduit, being adapted to be held at temperature above the condensation temperature of the solid material, and a closed-loop control system incorporating the pressure gauge being constructed to vary the conductance of the throttle valve to control the sub atmospheric pressure of the vapor downstream of the throttle valve in response to the output of the pressure gauge, flow of vapor to the vacuum chamber thereby being determined by pressure of the vapor in the region of the passage between the throttling valve and the vapor conduit, wherein the vaporizer is constructed to contain and evaporate indium trichloride, $InC_3$.

27. A vapor delivery system for delivering a controlled flow of vapor sublimated from a solid material to a vacuum chamber, comprising the combination of a heated vaporizer for the solid material operable at sub atmospheric pressure and a vapor delivery passage from the vaporizer to the vacuum chamber, the vapor delivery passage including a throttle valve followed by a vapor conduit a pressure gauge that is responsive to sub atmospheric pressure being located between the throttle valve and the vapor conduit, surfaces of the vapor delivery passage that are exposed to the sublimed vapor, including such surfaces of the throttle valve, the pressure gauge and the vapor conduit, being adapted to be held at temperature above the condensation temperature of the solid material, and a closed-loop control system incorporating the pressure gauge being constructed to vary the conductance of the throttle valve to control the sub atmospheric pressure of the vapor downstream of the throttle valve in response to the output of the pressure gauge, flow of vapor to the vacuum chamber thereby being determined by pressure of the vapor in the region of the passage between the throttling valve and the vapor conduit, wherein the vaporizer is constructed to contain and evaporate trimethyl indium, $In(CH_3)_3$.

28. A vapor delivery system for delivering a controlled flow of vapor sublimated from a solid material to a vacuum chamber, comprising the combination of a heated vaporizer for the solid material operable at sub atmospheric pressure and a vapor delivery passage from the vaporizer to the vacuum chamber, the vapor delivery passage including a throttle valve followed by a vapor conduit a pressure gauge that is responsive to sub atmospheric pressure being located between the throttle valve and the vapor conduit, surfaces of the vapor delivery passage that are exposed to the sublimed vapor, including such surfaces of the throttle valve, the pressure gauge and the vapor conduit, being adapted to be held at temperature above the condensation temperature of the solid material, and a closed-loop control system incorporating the pressure gauge being constructed to vary the conductance of the throttle valve to control the sub atmospheric pressure of the vapor downstream of the throttle valve in response to the output of the pressure gauge, flow of vapor to the vacuum chamber thereby being determined by pressure of the vapor in the region of the passage between the throttling valve and the vapor conduit, wherein the vaporizer is constructed to contain and evaporate triethyl antimony, $Sb(C_2H_5)_3$.

29. A method of delivering to a vacuum chamber a controlled flow of vapor sublimated from a solid material conducted by use of the vapor delivery system of claim 1.

30. The method of claim 29 in which the throttle valve employed in the vapor delivery system is of the butterfly type.

31. The method of claim 30 in which the useful dynamic range of the butterfly valve, between lowest and highest conductance, is about a factor of 10.

32. A method of producing an ion beam in a vacuum chamber conducted by use of the vapor delivery system of claim 18 to deliver a controlled ionizable flow of vapor sublimated from a solid material to an ionization chamber.

33. The method of claim 32 employing a vapor delivery system wherein the vapor flow rate is adapted to be determined by both a control system for the temperature of the vaporizer and said control system for the conductance of the throttle valve.

34. The method of claim 32 employing a vapor delivery system in which said throttle valve is of the butterfly type.

35. The method of claim 32 employing a vapor delivery system constructed to operate with a rechargeable fixed charge of solid material which is progressively consumed in a manner to reduce the vapor-emitting area of the solid material, and constructed, in response to a decrease in pressure beyond the throttle valve, to reset the position of the throttle valve to recover the desired flow, and also from time to time, as the throttle valve nears its maximum useful conductance, to elevate the temperature of the vaporizer to raise the pressure in the vaporizer and enable the throttle valve to operate within its preferred conductance dynamic range.

36. The method of claim 35 employing a vapor delivery system having a throttle valve-based sensing and control system capable of providing a vaporizer set-point temperature value to a regulator of a vaporizer heater that is capable of maintaining the vaporizer temperature at the set-point, the sensing and control system storing at least one predetermined valve displacement value representing a desired upper conductance limit for the throttle valve, the sensing and control system constructed to monitor the position of the throttle valve, and upon detecting the valve nearing or reaching that displacement value, the sensing and controller system constructed to raise the set-point temperature value to the regulator heater to cause increased vapor generation and vapor pressure upstream of the throttle valve, thereby to enable the closed loop control of the throttle valve to cause the valve to return to a substantially lower conductance position.

37. The method of claim 32 employed to delivery ionizable vapor to the ion source of an ion implanter.

38. A control system for controlling a vapor delivery system for delivering a controlled flow of vapor sublimated from a solid material to a vacuum chamber, the vapor delivery system comprising the combination of a heated vaporizer for the solid material operable at sub atmospheric pressure and a vapor delivery passage from the vaporizer to the vacuum chamber, the vapor delivery passage including a throttle valve followed by a vapor conduit, a pressure gauge that is responsive to sub atmospheric pressure being located between the throttle valve and the vapor conduit, a closed loop temperature control system for controlling the surfaces of the vapor delivery passage that are exposed to the sublimed vapor, including such surfaces of the throttle valve, the pressure gauge and the vapor conduit at a temperature above the condensation temperature of the solid material, and a closed-loop pressure control system configured to vary the conductance of the throttle valve to control the sub atmospheric pressure of the vapor downstream of the throttle valve in response to the output of the pressure gauge, so that the flow of vapor to the vacuum chamber is a function of the pressure of the vapor in the region of the passage between the throttling valve and the vapor conduit, wherein the control system is constructed to operate with a rechargeable fixed charge of solid material which is progressively consumed in a manner to reduce the vapor-emitting area of the solid material, and constructed, in response to a decrease in pressure beyond the throttle valve, to reset the position of the throttle valve to recover the desired flow, and also from time to time, as the throttle valve nears its maximum useful conductance, to elevate the temperature of the vaporizer to raise the pressure in the vaporizer and enable the throttle valve to operate within its preferred conductance dynamic range.

39. The control system of claim 38 in combination with a throttle valve-based sensing and control system capable of providing a vaporizer set-point temperature value to a regulator of a vaporizer heater that is capable of maintaining the vaporizer temperature at the set-point, the sensing and control system storing at least one predetermined valve displacement value representing a desired upper conductance limit for the throttle valve, the sensing and control system constructed to monitor the position of the throttle valve, and upon detecting the valve nearing or reaching that displacement value, the sensing and controller system constructed to raise the set-point temperature value to the regulator heater to cause increased vapor generation and vapor pressure upstream of the throttle valve, thereby to enable the closed loop control of the throttle valve to cause the valve to return to a substantially lower conductance position.

40. The control system of claim 39 including a reference table of predetermined increments of temperature rise suitable for operation, and the sensing and control system effective, upon detecting the valve nearing or reaching said displacement value, to cause the vaporizer temperature set-point to be incremented to the next step in the reference table.

* * * * *